United States Patent
Jiang et al.

(10) Patent No.: US 9,915,522 B1
(45) Date of Patent: Mar. 13, 2018

(54) OPTIMIZED SPATIAL MODELING FOR OPTICAL CD METROLOGY

(71) Applicants: Peilin Jiang, Santa Clara, CA (US); Leonid Poslavsky, Belmont, CA (US)

(72) Inventors: Peilin Jiang, Santa Clara, CA (US); Leonid Poslavsky, Belmont, CA (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 836 days.

(21) Appl. No.: 14/294,540

(22) Filed: Jun. 3, 2014

Related U.S. Application Data

(60) Provisional application No. 61/830,536, filed on Jun. 3, 2013.

(51) Int. Cl.
| | |
|---|---|
| G06F 7/60 | (2006.01) |
| G06F 17/10 | (2006.01) |
| G01B 11/02 | (2006.01) |
| G06F 17/50 | (2006.01) |

(52) U.S. Cl.
CPC .......... *G01B 11/02* (2013.01); *G06F 17/5009* (2013.01)

(58) Field of Classification Search
CPC ............ G02B 27/4266; G01N 21/4788; G06T 17/20; G06T 19/00; G06T 2200/00; G06T 2200/04; G06T 2200/08; G03F 7/705; G01B 11/02; G06F 17/50; G06F 17/5009; G06F 17/5018
See application file for complete search history.

(56) References Cited

U.S. PATENT DOCUMENTS

| | | | |
|---|---|---|---|
| 5,164,790 A * | 11/1992 | McNeil | G01B 11/02 356/496 |
| 6,919,964 B2 | 7/2005 | Chu | |
| 7,038,850 B2 | 5/2006 | Chang et al. | |
| 8,510,091 B1 * | 8/2013 | Zhao | G06F 17/5018 343/767 |

(Continued)

OTHER PUBLICATIONS

Borre, K.; Plane Networks and their Application; Birkhauser Boston, 2001. p. 109-110. ISBN 0-8176-4193-9.*

(Continued)

*Primary Examiner* — Aniss Chad
*Assistant Examiner* — John E Johansen
(74) *Attorney, Agent, or Firm* — Womble Bond Dickinson (US) LLP

(57) ABSTRACT

Provided are scatterometry techniques for evaluating a 3D diffracting structure. In one embodiment, a method involves providing a 3D spatial model of the diffracting structure and discretizing the model into a 3D spatial mesh. The method includes approximating 3D fields for each element of the 3D mesh using 3D spatial basis functions and generating a matrix including coefficients of the 3D spatial basis functions approximating the fields. The coefficients of the 3D spatial basis functions are computed and used in computing spectral information for the model. The computed spectral information for the model is compared with measured spectral information for the diffracting structure. If the model is a good model fit, the method involves determining a physical characteristic of the diffracting structure based on the model of the diffracting structure.

26 Claims, 13 Drawing Sheets

(56) References Cited

U.S. PATENT DOCUMENTS

| | | | |
|---|---|---|---|
| 2005/0117169 A1* | 6/2005 | Weitzel | G01B 11/22 356/521 |
| 2007/0208547 A1* | 9/2007 | Graglia | G06F 17/5018 703/2 |
| 2010/0145655 A1 | 6/2010 | Chu | |
| 2013/0066597 A1* | 3/2013 | Van Beurden | G01N 21/4788 703/1 |

OTHER PUBLICATIONS

Chen, M. and Rahman, M., Water wave diffraction analysis by boundary elements Applied Mathematic Modelling, vol. 18 (Mar. 1994), pp. 114-117, 121.*

Wave Optics Module User's Guide, Version 4.3b. Datasheet[online]. COMSOL, May 2013 [Retrieved Jan. 27, 2017]. Retrieved from the internet:<http://hpc.mtech.edu/comsol/pdf/Wave_Optics_Module/WaveOpticsModuleUsersGuide.pdf> pp. 6, 46, 72-73, 94.*

Hobbs, P. D. H. Building Electro-Optical Systems: Making it All Work Second Edition. N. Y., John Wiley & Sons, 2009. p. 19, 23 TA 1750.H63 2008.*

Wu, P. and Houstis, E. N.; Parallel Dynamic Mesh Generation and Domain Decomposition; Purdue University Technical Report, Dec. 1993, pp. 1-4. CSD-TR-93-075.*

Hoppe, H. and DeRose, T. and Duchamp, T. and McDonald, J. and Stuetzle, W.; Mesh Optimization; Association for Computing Machinery, 1993, pp. 19-26. ACM-0-89791-601-8/93/008.*

Zschiedrich, Lin, et al. "A rigorous finite-element domain decomposition method for electromagnetic near field simulations." arXiv preprint arXiv:0803.1068 (2008). pp. 1-9.*

M. G. Moharam et al., "Formulation for stable and efficient implementation of the rigorous coupled-wave analysis of binary gratings," J. Opt. Soc. Am. A, vol. 12, pp. 1068-1076, 1995.

M. Pisarenco et al., "An extended Fourier modal method foro plane-wave scattering from finite structures," CASA-Report 10-11, Eindhoven University of Technology, 2010.

Y. Shao, Z. Peng, K. H. Lim, and J. F. Lee, "Non-conformal domain decomposition methods for time-harmonic Maxwell equations," Proceedings of the Royal Society A, doi: 10.1098/rspa.2012.0028.

Z. Peng et al., "Non-conformal domain decomposition method with mixed true second order transmission condition for solving large finite antenna arrays," IEEE Trans. Antennas Propag., vol. 59, pp. 1638-1651, 2011.

P. Lalanne and G. M. Morris, "Highly improved convergence of the coupled-wave method for TM Polarization," J. Opt. Soc. Am. A, vol. 13, pp. 779-784, 1996.

L. Li, "Use of Fourier series in the analysis of discontinuous periodic structures," J. Opt. Soc. Am. A, vol. 13, pp. 1870-1876, 1996.

T. Schuster, J. Ruoff, N. Kerwien, S. Rafler, and W. Osten, "Normal vector method for convergence improvement using the RCWA for crossed gratings," J. Opt. Soc. Am. A, vol. 24, pp. 2880-2890, 2007.

I. Gushchin and A. V. Tishchenko, "Fourier modal method for relief gratings with oblique boundary conditions," J. Opt. Soc. Am. A, vol. 27, pp. 1575-1583, 2010.

A. Schädle, L. Zschiedrich, S. Burger, R. Klose, and F. Schmidt, "Domain decomposition method for Maxwell's equations: scattering off periodic structures," J. Comput. Phys., pp. 1-24, 2006.

* cited by examiner

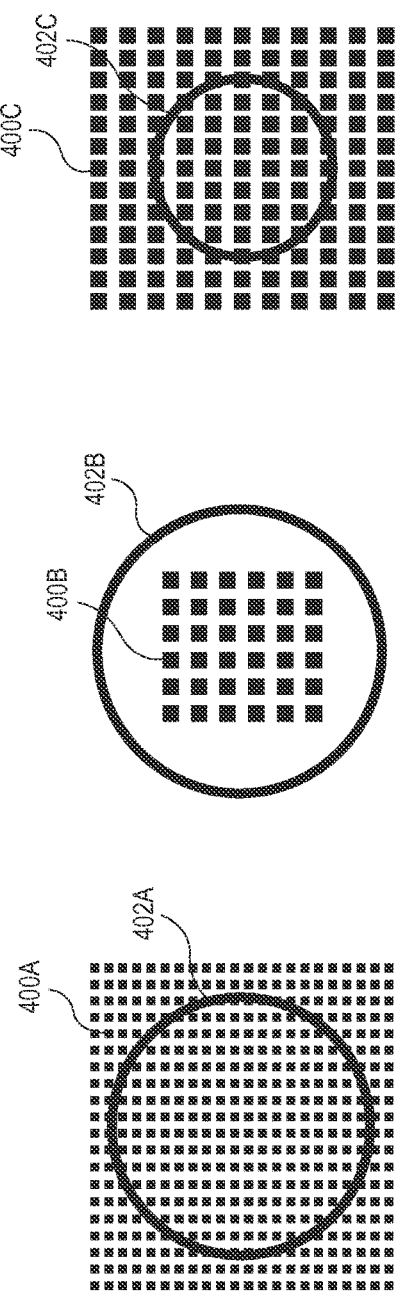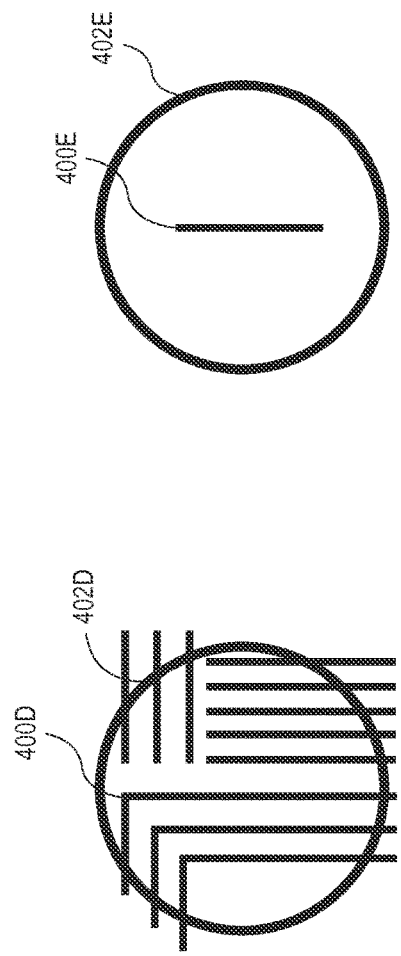

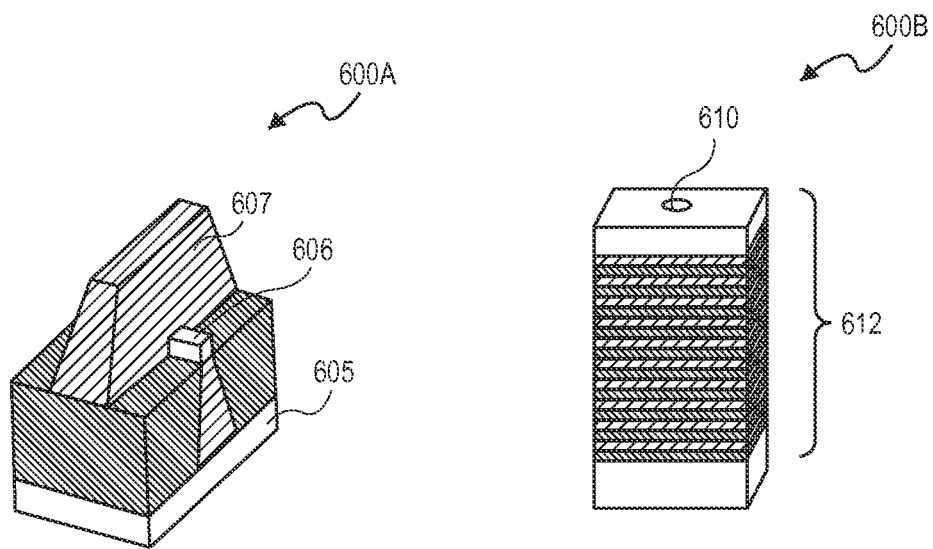
FIG. 6A
FIG. 6B
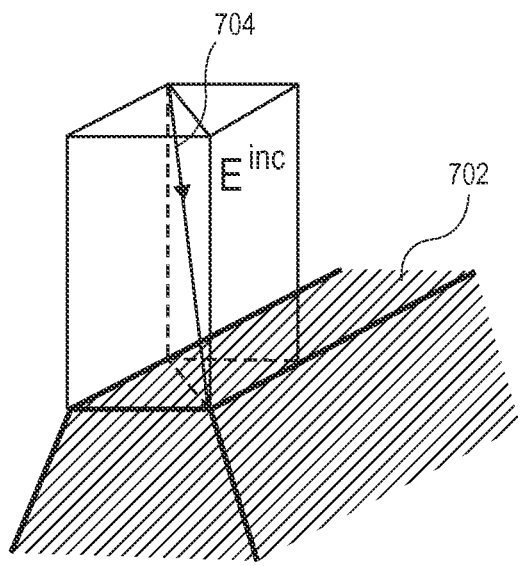
FIG. 7

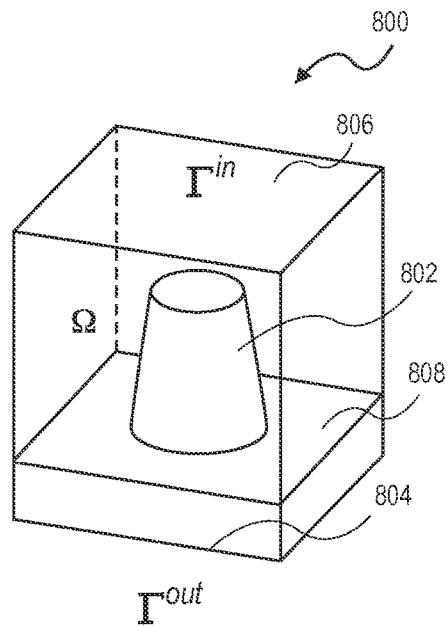
FIG. 8
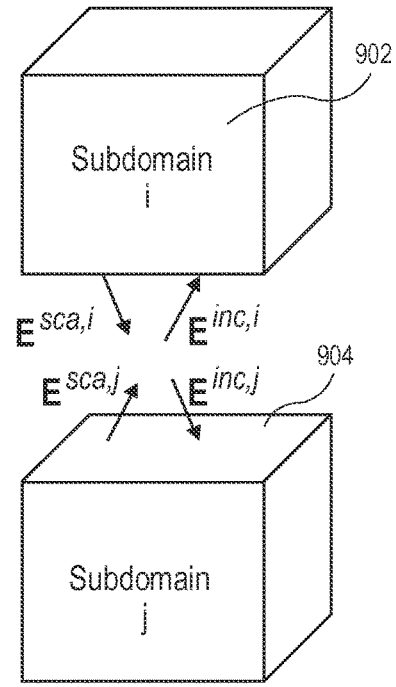
FIG. 9
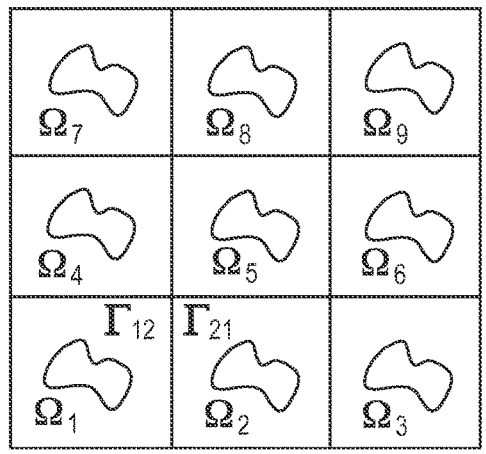
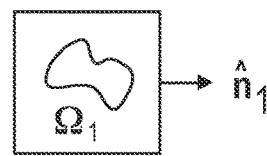
FIG. 10

US 9,915,522 B1

OPTIMIZED SPATIAL MODELING FOR OPTICAL CD METROLOGY

PRIORITY

This application is a Non-Provisional of and claims priority to the U.S. Provisional Patent Application No. 61/830,536 filed Jun. 3, 2013.

TECHNICAL FIELD

Embodiments of the invention pertain to scatterometry and more particularly to evaluation of a three-dimensional (3D) diffracting structure.

BACKGROUND

Optical metrology techniques generally referred to as scatterometry offer the potential to characterize parameters of a workpiece (i.e., a sample) during a manufacturing process. In practice, light is directed onto a periodic grating formed in a workpiece and spectra of reflected light are measured and analyzed to characterize the grating. Characterization parameters may include critical dimensions (CDs), sidewall angles (SWAs) and heights (HTs) of gratings, material dispersion parameters, and other parameters that affect the polarization and intensity of the light reflected from or transmitted through a material. Characterization of the grating may thereby characterize the workpiece as well as the manufacturing process employed in the formation of the grating and the workpiece.

For example, the optical metrology system 100 depicted in FIG. 1 can be used to determine the profile of a grating 102 formed on a semiconductor wafer 104. The grating 102 can be formed in test areas on the wafer 104, such as adjacent to a device formed on the wafer 104. The optical metrology system 100 can include a photometric device with a source 106 and a detector 112. The optical metrology system 100 illuminates the grating 102 with an incident beam 108 from a source 106. In the illustrated embodiment, the optical metrology system 100 directs the incident beam 108 onto the grating 102 at an angle of incidence $\theta_i$ with respect to a normal of the grating 102 and an azimuth angle $\phi$ (e.g., the angle between the plane of incidence beam 108 and the direction of the periodicity of the grating 102). A diffracted beam 110 leaves at an angle $\theta_d$ with respect to the normal and is received by the detector 112. The detector 112 converts the diffracted beam 110 into a measured metrology signal including spectral information. To determine the profile of the grating 102, the optical metrology system 100 includes a processing module 114 configured to receive the measured metrology signal and analyze the measured metrology signal.

Analysis of measured metrology signal generally involves comparing the measured sample spectral information to simulated spectral information to deduce a scatterometry model's parameter values that best describe the measured sample. The simulated spectral information is generally based on a solution to Maxwell's equations. Existing methods of solving Maxwell's equations typically involve rigorous coupled-wave analysis (RCWA) using Fourier analysis. RCWA using Fourier analysis involves transforming functions from the spatial domain to the spectral domain, and solving functions in the spectral domain. Models using Fourier analysis can have the advantage of being implementable without specialist knowledge of numerical method. However, existing RCWA methods make an assumption that the structure being analyzed is periodic. Furthermore, computing spectral information with existing methods can be very time-consuming and resource-intensive. Thus, computations using existing methods can inhibit providing measurements in a sufficiently timely manner for use in some applications such as semiconductor manufacturing.

BRIEF DESCRIPTION OF THE DRAWINGS

Embodiments of the present invention are illustrated by way of example, and not by way of limitation, in the figures of the accompanying drawings, in which:

FIGS. 4A-4E are top-down views of exemplary diffracting structures that may be evaluated according to methods described herein;

FIG. 6A is a perspective view of an exemplary diffracting structure having a 3D structure in between 2D structures, which may be evaluated according to methods described herein;

FIG. 6B is a perspective view of an exemplary diffracting structure having a 3D structure in a film stack, which may be evaluated according to methods described herein;

FIG. 7 is a perspective view of conical illumination on a 2D grating, in accordance with embodiments of the invention;

FIG. 8 illustrates a subdomain of a model of a diffracting structure, in accordance with embodiments of the invention;

FIG. 9 illustrates incident and scattered fields between two subdomains, in accordance with embodiments of the invention;

FIG. 10 illustrates an exemplary cell array including subdomains of a model of a diffracting structure, which may be used in evaluating the diffracting structure in accordance with embodiments of the invention;

DETAILED DESCRIPTION

Figure 1:
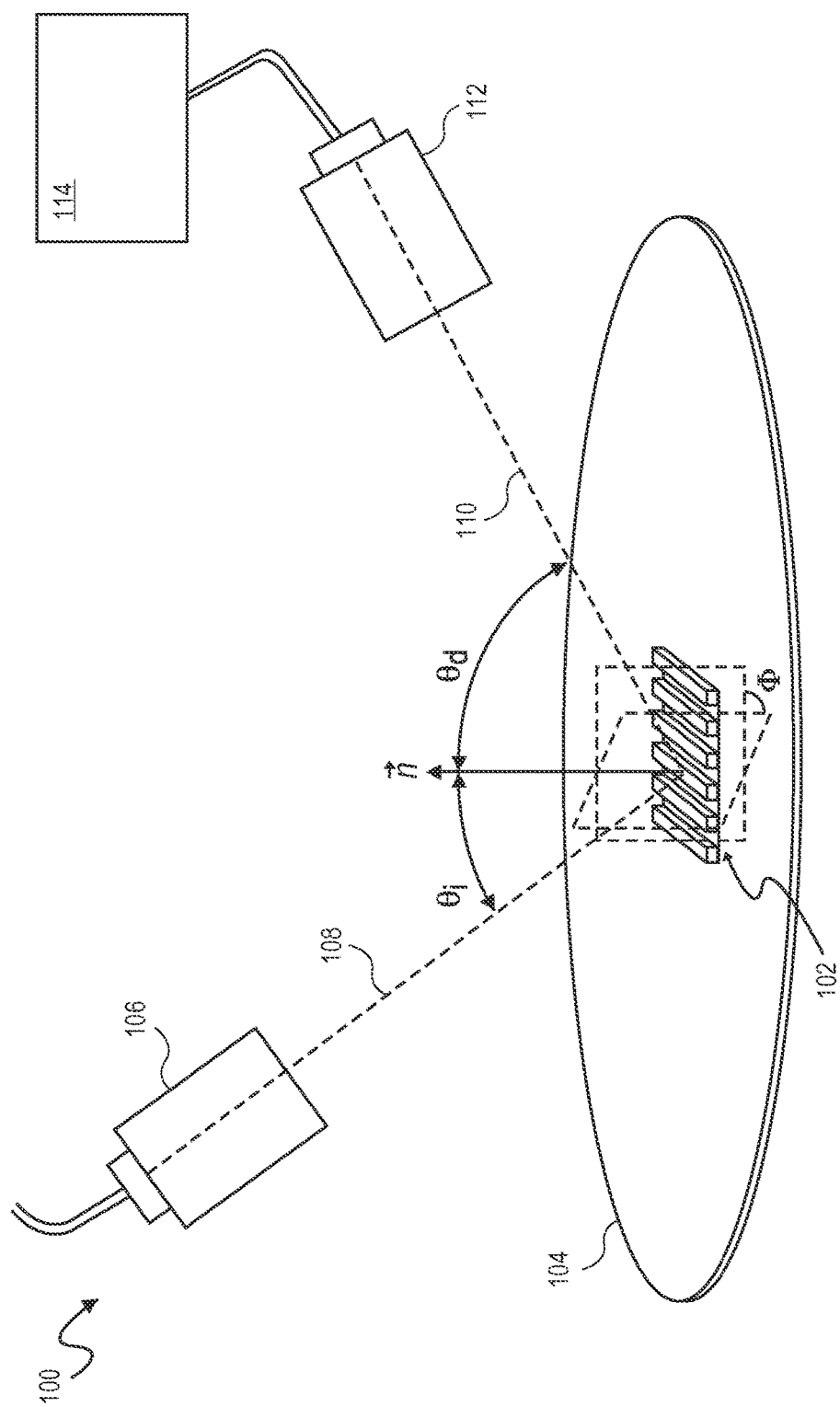
FIG. 1 depicts an optical metrology system for scatterometry.

Embodiments of the invention include finite element methods for evaluating diffracting structures, including 3D diffracting structures. A 3D diffracting structure is a structure that is not uniform in all the x, y, and z directions. A 3D diffracting structure may include, for example, one or more 2D and/or 3D features such as a multi-layered film stack with a grating, or any other diffracting structure.

When measuring complex 3D grating structures made of high-k materials (e.g. metals and silicon), the reflectance computation via existing methods (e.g., RCWA) takes a large amount of time to satisfy accuracy requirement and can be a major stumbling block in improving throughput. Such increasingly complex structures in semiconductor devices, such as FinFET, DRAM, SRAM, and VNAND, etc., pose more and more challenges to CD metrology. For example, RCWA may have deficiencies in convergence when dealing with structures in the following circumstances: when high contrasts exist (e.g., when the grating material is silicon or metals), when the aspect ratio of the grating is high (e.g., as in VNAND), or when there are fine structures in the gratings (e.g., as in FinFET). Such deficiencies may result from, for example, the use of Fourier series, which are entire domain basis functions. Fourier series basis functions may need more terms of series to achieve sufficient resolution at local discontinuities. Furthermore, existing methods involve staircase approximations in the vertical direction, which can result in low convergence rates.

Moreover, existing RCWA methods assume that the structures under measurement are periodic and the illumination is a plane wave, which may not apply in some latest scatterometry technologies. For example, in beam profile reflectometry (BPR), a spot spanning several periods is generated, and the incident light intensity is nonuniformly distributed on the aperture. Even in methods involving perfectly matched layer (PML)-enhanced RCWA for aperiodic structures, there may be hundreds of rays to be simulated on the apertures (e.g., if angular spectrum decomposition is used), which implies long simulation time. Some existing methods using RCWA perform parallelization according to wavelengths. However, when the number of nodes is much larger than the number of wavelengths, benefits from the large node number would be lost.

In contrast, embodiments of the present disclosure may involve finite element methods using spatial basis functions. Some embodiments further use curvilinear modeling, which can make a significant difference in the convergence rate, especially when large contrast exists. Embodiments can enable using the same parallelization strategy for a variety of circumstances, including when the system matrix from the finite element method is not very large. For example, parallelization may be performed on a lower level, such as partitioning of the system matrix from the finite element method. The sparse matrices generated from the finite element method may enable even better load-balancing in parallelization, which can be beneficial when using clusters with large amount of nodes. As is described in more detail below, some embodiments include parallelization according to subdomains in domain decomposition, and can achieve a high speedup ratio when the number of nodes is not very large. Thus, embodiments enable using a single approach to evaluate a variety of diffracting structures, including periodic and aperiodic structures, in contrast to existing methods. Embodiments may further enable improvements in the speed of evaluation of diffracting structures. Furthermore, according to embodiments for evaluating aperiodic structures, the methods do not require plane wave incidence, and therefore the fields on the aperture can be obtained in one shot.

In one embodiment, a method of evaluating a diffracting structure involves providing a 3D spatial model of the diffracting structure, and discretizing the model into a 3D spatial mesh. The model further involves approximating 3D fields for each element of the 3D mesh using 3D spatial basis functions. A matrix including coefficients of the 3D spatial basis functions is generated, and the coefficients are computed. The method involves computing spectral information for the model based on the computed coefficients, and comparing the computed spectral information for the model with measured spectral information for the diffracting structure. In response to a good model fit, a physical characteristic of the diffracting structure may be determined based on the model of the diffracting structure.

In the following description, numerous details are set forth. It will be apparent, however, to one skilled in the art, that the present invention may be practiced without these specific details. For example, while the present methods are described in the context of scatterometry for diffraction grating parameter measurements, it should be appreciated that the methods may be readily adaptable to other contexts and applications by one of ordinary skill in the art.

In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

Some portions of the detailed descriptions provide herein are presented in terms of algorithms and symbolic representations of operations on data bits within a computer memory. Unless specifically stated otherwise, as apparent from the following discussion, it is appreciated that throughout the description, discussions utilizing terms such as "calculating," "computing," "determining" "estimating" "storing" "collecting" "displaying," "receiving," "consolidating," "generating," "updating," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices. As used herein, "model" refers to a scatterometry model and "parameter" refers to a model parameter of the scatterometry model unless otherwise specified. Although some of the following examples are described in terms of a Cartesian coordinate system, other coordinate systems may be used.

Figure 2:
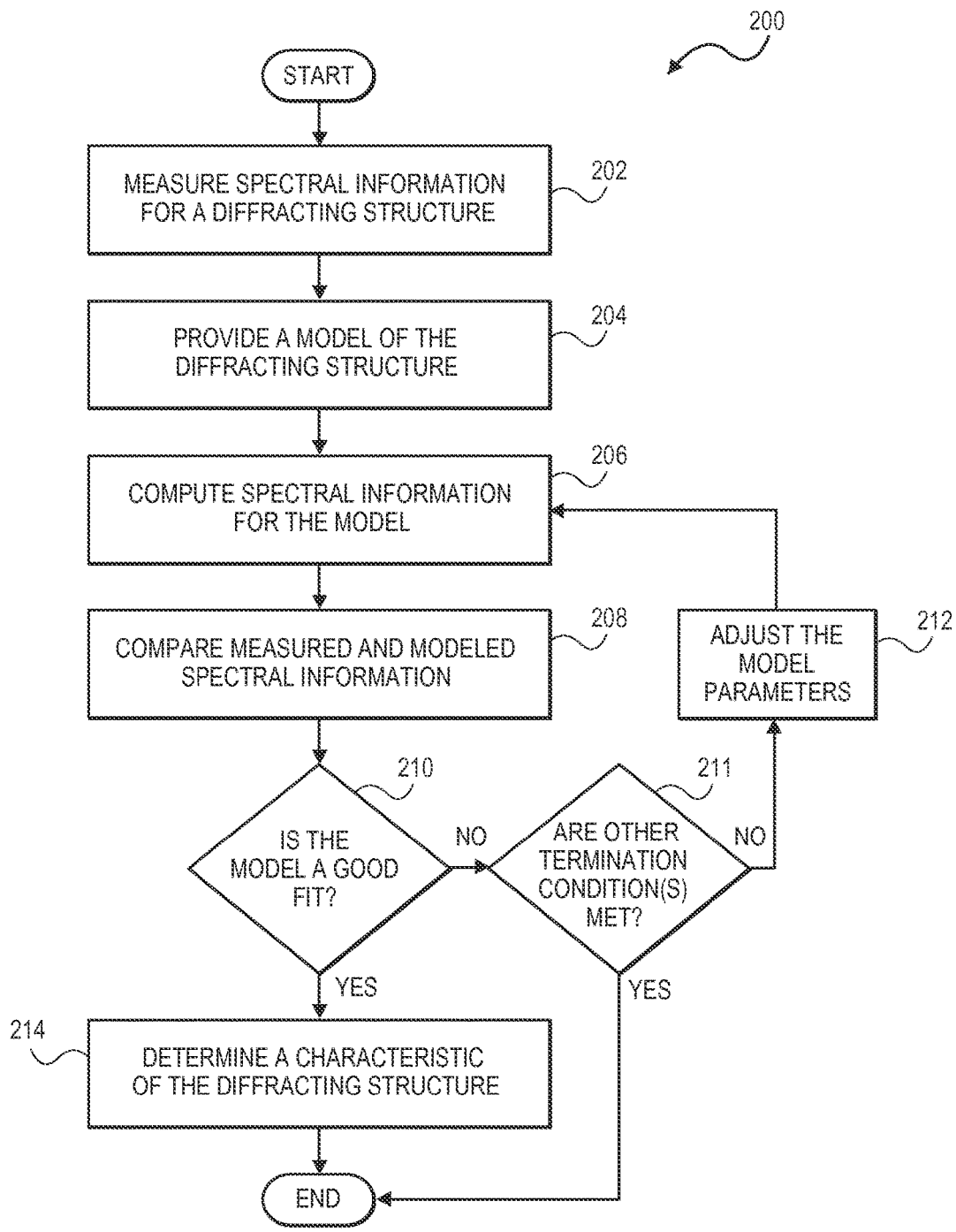
FIG. 2 is a flow diagram illustrating a general method for evaluating a diffracting structure, in accordance with an embodiment of the invention.

FIG. 2 is a flow diagram illustrating a general method for evaluating a diffracting structure, in accordance with an embodiment of the invention. An optical metrology system may perform the method 200 of FIG. 2. An optical metrology system may include a processing module, a light source for illuminating a sample, and/or a detector for measuring reflected light, such as the system 100 of FIG. 1. Additionally or alternatively, an optical metrology system may include components such as in the optical metrology system 1304 of FIG. 13, which is described in more detail below.

The method 200 begins at block 202 with an optical metrology system performing measurements of a sample with a 3D diffracting structure. Performing measurements involves shining light on the sample and measuring spectral information for the sample such as reflectance. At block 204, the optical metrology system identifies or provides an initial model of the measurement process. Providing the initial model of the measurement process includes constructing a geometric model of the diffracting structure, determining how to parameterize the geometric model, characterizing the incident light, and characterizing the optical measurement system.

At block 208, the optical metrology system attempts to fit the modeled data obtained at block 206 to the measured data obtained at block 202. Fitting the modeled data generally involves comparing the modeled data to the measured data and determining an error between the two sets of data. At block 210, the optical metrology system determines whether the model is a good fit. According to one embodiment, the model is a good fit if the error between the modeled data and the measured data is less than a predetermined value. If the model is a good fit, the optical metrology system determines a characteristic of the 3D diffracting structure at block 214. If the model is not a good fit, the optical metrology system determines if any other termination conditions have occurred at block 211. Termination conditions can include, for example: reaching a maximum number of iterations, determining that the difference between the previous model parameters and current model parameters is less than a threshold value, and/or any other conditions justifying discontinuing further model iterations. If a termination condition is not met, the optical metrology system adjusts the model parameters at block 212, and repeats the operations at blocks 206-210. The initial model identified is generally based on expected parameters of the diffracting structure, and typically results in an error significant enough to require additional iterations of blocks 206-210.

Upon completing multiple iterations of blocks 206-210, the scatterometry model is typically close enough to the actual diffracting structure that determining characteristics of the actual 3D diffracting structure at block 214 may simply involve ascertaining the best fit model parameters. This can be true, for example, for geometric parameters that have a one-to-one correspondence with a single parameter used in the scatterometry model. Determining other parameters of the actual diffracting structure may involve additional operations such as adding two parameters of the scatterometry model together.

The above-described method 200 of FIG. 2 is a general method for evaluating a diffracting structure in accordance with an embodiment of the invention. FIGS. 3A-3D are flow diagrams illustrating specific examples of methods for evaluating a diffracting structure. Like the method 200 of FIG. 2, the methods of FIGS. 3A-3D may be performed by an optical metrology system such as the systems described with respect to FIG. 1 and FIG. 13.

Figure 3A:
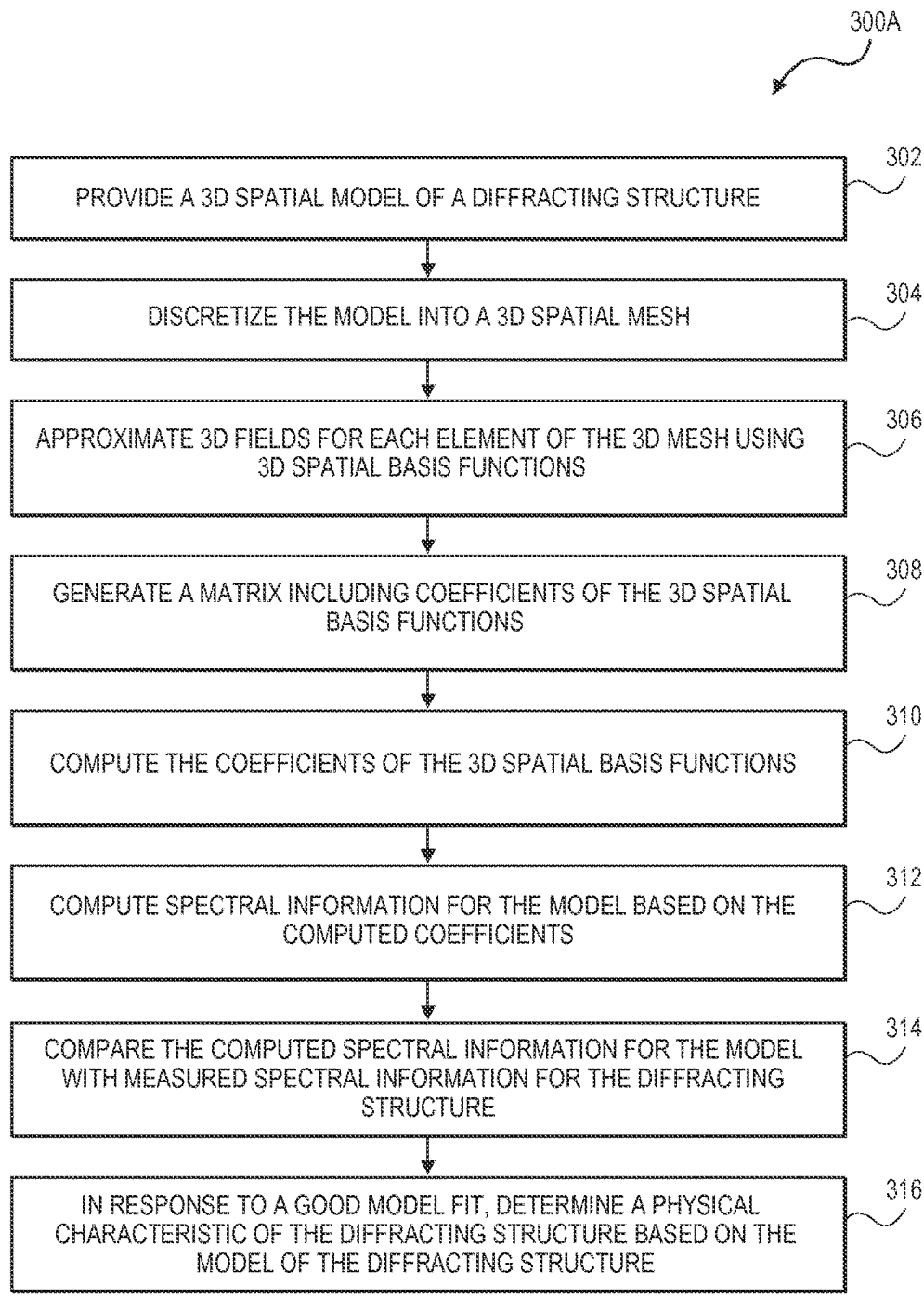
FIG. 3A is a flow diagram illustrating a method for evaluating a diffracting structure, in accordance with an embodiment of the invention.

Referring to FIG. 3A, the method 300A begins with providing a 3D spatial model of the diffracting structure, at block 302. A 3D spatial model includes a geometric model of the diffracting structure in three dimensions. Providing a 3D spatial model may also include determining how to parameterize the 3D geometric model, characterizing the incident light, and characterizing the optical measurement system. Examples of 3D model parameters include: CDs, SWAs and HTs of gratings, material dispersion parameters, layer thicknesses, angle of incidence of light directed onto the diffracting structure, calibration parameters of the optical measurement system, and/or any other parameters that may affect polarization, intensity, or measurement of the light reflected from or transmitted through a material.

Embodiments of the invention enable evaluating a wide range of structures with the same scheme. For example, embodiments may involve evaluation of target structures that are periodic, aperiodic, or periodic but finite, and may involve various types of incident illumination. For example, the incident illumination may be plane wave, conical (e.g., "spot"), or other types of illumination. FIG. 7 is a perspective view of conical illumination on a 2D grating 702, in accordance with embodiments of the invention. The conical illumination results in a finite spot of light on the sample, shown as incident fields $E_{inc}$ 704.

FIGS. 4A-4E illustrates examples of different diffracting structures that may be evaluated according to methods described herein. Referring to FIGS. 4A-4E, the circles represent the boundaries of the spots (e.g., non-plane wave incident illumination), while the lines denote the targets. In FIG. 4A, both the size of the target 400A and the size of the spot 402A are large. In the example illustrated in FIG. 4A, the structure 400A can be considered to be periodic in two directions (e.g., defined as parallel to the wafer plane). In this case, the size of the spot 402A formed by the illumination on the wafer may be so large that it spans over a sufficient number of periods and the structures can be approximated as periodic. In FIG. 4B, the size of the spot 402B may be large, but the size of the target 400B is finite. In FIG. 4C, the target 400C may be large, but the size of the spot 402C is finite (e.g., a beam). In FIG. 4D, the size of the spot 402D may be large, and the target 400D is aperiodic. FIG. 4E illustrates another example of an aperiodic target 400E (e.g., as illustrated, an isolated line), which may be illuminated by a relatively large spot 402E. As indicated, embodiments may involve evaluation of a 3D diffracting structure that is periodic or aperiodic. An example of a periodic structure can include a grating, such as the diffracting structures 500A of FIG. 5A or 500B of FIG. 5B. The gratings 500A and 500B may include patterned metal, and/or non-metal lines, according to embodiments.

Figure 5A:
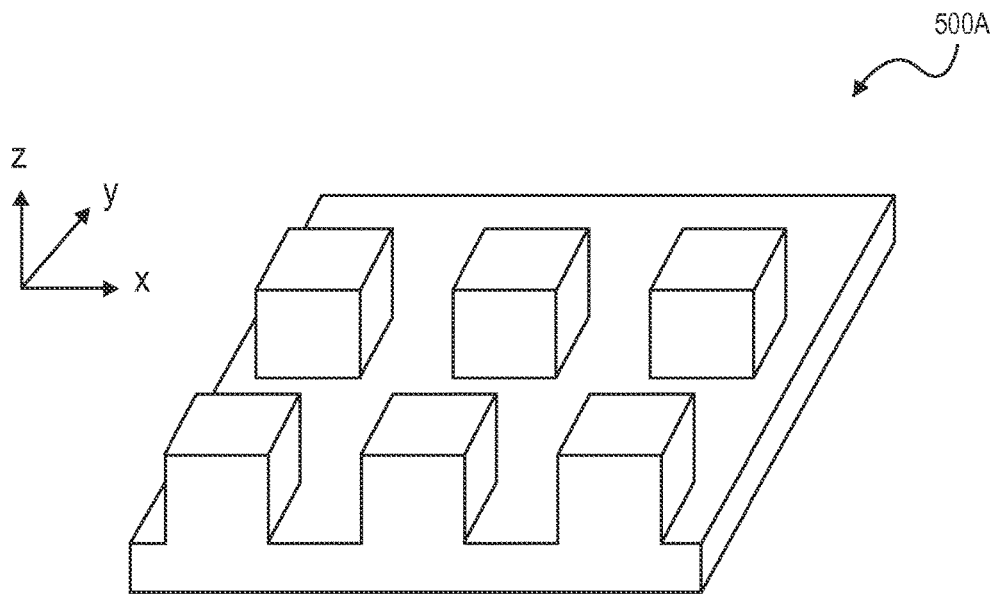
FIG. 5A illustrates a 3D diffracting structure including a periodic grating with a profile that varies in the x-y plane, in accordance with an embodiment of the invention.

FIG. 5A illustrates an "island grating" 500A, which is periodic in two dimensions. The periodic grating 500A has a profile that varies in the x-y plane. The periodic grating 500A is also symmetric in two dimensions (here, in the x- and y-dimensions). A grating is symmetric in a dimension if the grating is the same on either side of a symmetry plane. For example, a grating is symmetric in the x-dimension if the grating is the same on either side of a plane defined by x=constant.

Figure 5B:
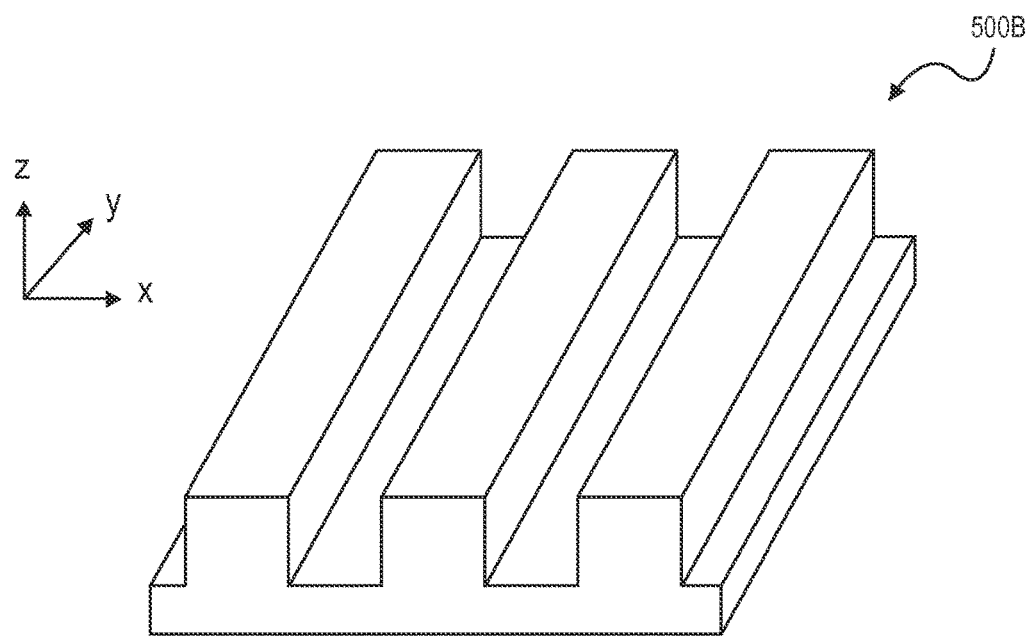
FIG. 5B illustrates a 3D diffracting structure including a periodic grating with a profile that varies in the x-direction but not in the y-direction, in accordance with an embodiment of the invention.

FIG. 5B illustrates a periodic grating having a profile that varies in the x-direction but not in the y-direction. Thus, periodic grating 500B is periodic in one dimension. It is to be understood that the lack of variation in the y-direction for a two-dimensional structure need not be infinite, but any breaks in the pattern are considered long range, e.g., any breaks in the pattern in the y-direction are spaced substantially further apart than the breaks in the pattern in the x-direction.

Referring again to FIG. 3A, at block 304, the method 300A continues with discretization of the 3D model into a 3D spatial mesh. Typically, discretizing the 3D model into a 3D spatial mesh involves discretization into a mesh of two or more elements. However, as used herein, the entire 3D model may also be "discretized" into a "mesh" with a single element. According to embodiments, the 3D mesh enables high geometric fidelity when performing discretization using curvilinear elements. In contrast, the RCWA typically adopts staircase approximation of sidewalls in the vertical direction, which is one of the root causes of a low convergence rate. Some embodiments may involve local mesh resolution enhancement techniques, such as mesh refinement, polynomial order elevation, or other mesh resolution enhancement techniques. Mesh resolution enhancement techniques can be especially beneficial in some embodiment involving the measurement of complex 3D grating structures made of materials such as metals and silicon which have large values of k at some wavelengths.

At block 306, the method 300A involves approximating 3D fields for each element of the 3D mesh using 3D spatial basis functions. Conventional methods involve rigorous coupled wave analysis (RCWA), which assume that the structures are periodic and therefore uses the Fourier series as basis functions to approximate the field distributions in the horizontal plane. Such conventional methods may be disadvantageous. For example, the assumption that the structures are periodic in the horizontal plane is often inaccurate because of effects due to finite beam size, finite target size, and/or aperiodic target. Additionally, the RCWA is a spectral solver since it uses entire-domain basis functions (e.g., Fourier series). As indicated above, when local material discontinuities are abrupt, the number of retained Fourier series should be very large in order to ensure desired accuracy, which implies a large amount of simulation time. In contrast, embodiments involve approximating fields using 3D spatial basis functions, which are in the spatial domain (e.g., not the spectral domain). The basis functions are 3D in the sense that they approximate fields in the 3D elements of the mesh (e.g., as opposed to being limited to approximating fields in a 2D element). In one embodiment, the basis functions are polynomial functions. Examples of 3D spatial basis functions are described below with respect to the methods of FIGS. 3B-3D. In some embodiments described below, the 3D spatial basis functions may also be "subdomain" basis functions that approximate fields in a subdomain (as opposed to the entire domain).

The method 300A further involves generating a matrix including coefficients of the 3D spatial basis functions approximating the fields, at block 308, and solving the matrix (e.g., computing the coefficients of the 3D spatial basis functions), at block 310. At block 312, the method 300A involves computing spectral information for the model based on the computed coefficients. Computing spectral information from the generated matrix may be done according to any appropriate method known in the art. After computing spectral information for the model, the method 300A involves comparing the computed spectral information for the model with measured spectral information for the diffracting structure, at block 314. If the model is a good fit, the method 300A involves determining a physical characteristic of the diffracting structure based on the model of the diffracting structure, at block 316. Determining a physical characteristic of the structure may include, for example, determining a geometric or material characteristic of the structure based on the model.

Figure 3B:
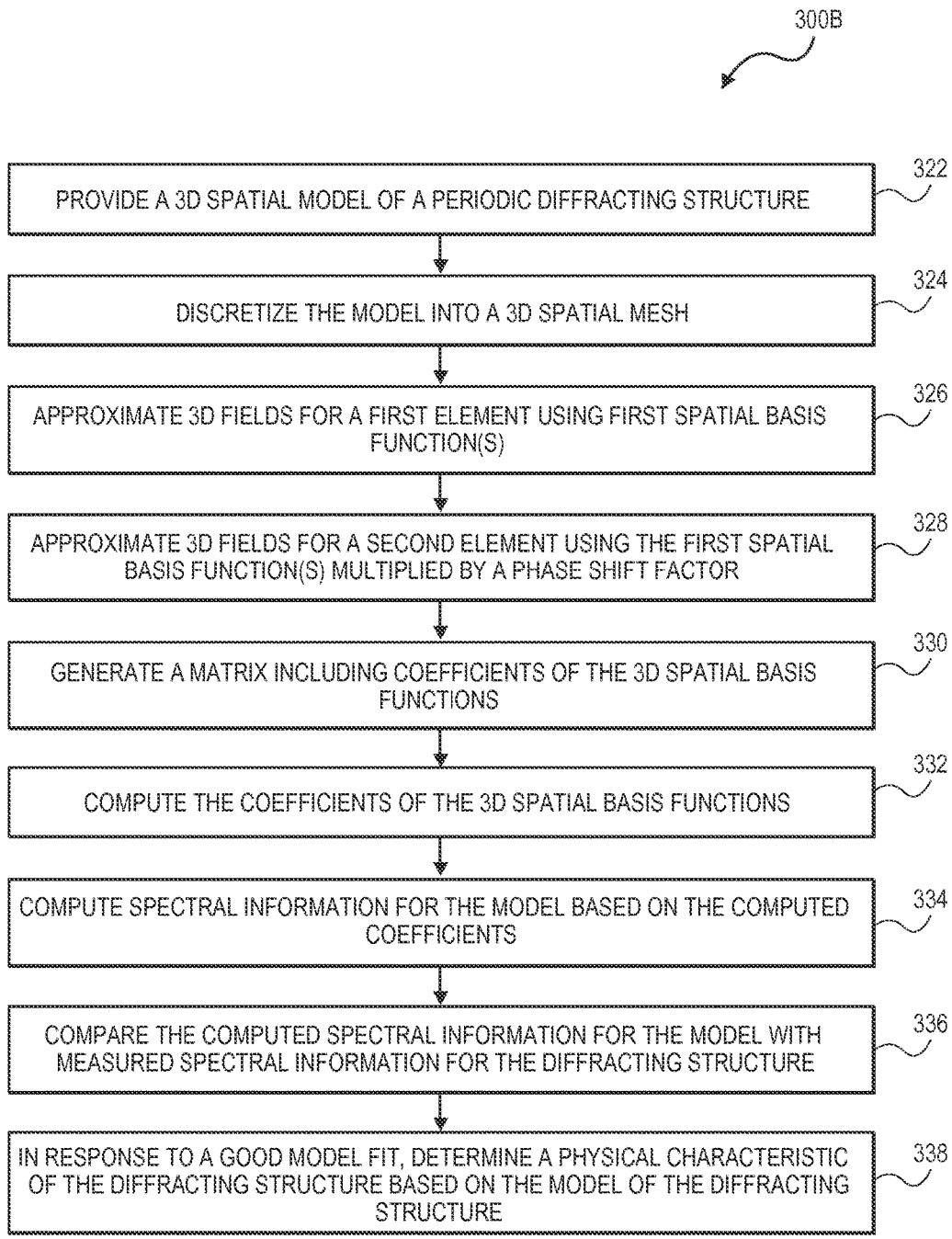
FIG. 3B is a flow diagram illustrating a method for evaluating a 3D periodic diffracting structure involving finite element analysis, in accordance with an embodiment of the invention.

FIG. 3B illustrates another exemplary method 300B for evaluating a diffracting structure, in accordance with an embodiment of the invention. The method 300B may be used for evaluating a periodic structure using a finite element method, in accordance with an embodiment of the invention. For example, the method 300B may be used when the size of the spot formed by the illumination on a sample is large enough so that it spans over a sufficient number of periods and the structures can be approximated as periodic (e.g., as illustrated in FIG. 4A). Like the method 300A of FIG. 3A, the method 300B begins with providing a 3D model of the 3D diffracting structure at block 322. According to the embodiment in FIG. 3B, providing the model involves defining the permittivity of the 3D periodic structure in accordance with equation (1):

$$\epsilon(r+n_x p_x \hat{x}+n_y p_y \hat{y})=\epsilon(r) \quad (1)$$

where $p_x$ and $p_y$ are the pitches in the x and y directions, respectively. Thus, the permittivity of the diffracting structure can be expressed as a function of pitch in one or more directions of periodicity. In equation (1), $n_x$ corresponds to periodicity in the x direction, and $n_y$ corresponds to periodicity in the y direction. For example, if $n_x$ is 0 and $n_y$ is 1, the structure is periodic in the y direction, but not the x direction.

Providing the model may further involve defining the distribution of the electric fields in the 3D diffracting structure. In one embodiment, the distribution of electric fields is governed by the following wave equation (2):

$$\nabla \times \nabla \times E - k^2 E = 0 \quad (2)$$

where E is the electric field in the 3D diffracting structure and k is the wave number. After introducing the weighting function W, the method 300B may involve determining a weak formulation of the expression of the 3D fields, such as is defined by equation (3):

$$\int_\Omega (\nabla \times E \cdot \nabla \times W - k^2 E \cdot W) dV - \int_\Gamma (\nabla \times E) \cdot (\hat{n} \times W) dS = 0 \quad (3)$$

where V is the volume of the 3D structure, S is surface of the 3D structure, n is the unit normal vector of the surface, and where E and W∈H(curl,Ω). In equation (3), Ω refers to the space enclosed by the periodic boundaries and the input and output ports, and Γ may include the periodic boundaries, the input and the output ports, and all the interfaces between different materials. According to one embodiment, because of the judicious choice of the basis functions, Γ may only include $\Gamma_{in}$ and $\Gamma_{out}$ as illustrated in FIG. 8, which is described in more detail below. The weighting function, W, can be of any form, and in some embodiments, W is the same as the basis functions (in which case the corresponding scheme is called the Galerkin formulation). The boundary integral in equation (3) (the integral over Γ with respect to S in equation (3)) includes the fields associated with periodic boundaries and interfaces.

In one embodiment, defining the model further involves defining boundary conditions for the model. For example, in one embodiment, the method 300B may involve determining an expression for the 3D fields as a function of the angle of the incident light and the pitch in one or more directions of periodicity. In one such example, quasi-periodic boundary conditions for the 3D model may be defined by the following equations (4) and (5):

$$E(r+n_x p_x \hat{x}+n_y p_y \hat{y})=e^{ik_\rho^{inc}\cdot(n_x p_x \hat{x}+n_y p_y \hat{y})}E(r) \quad (4)$$

$$\nabla \times E(r+n_x p_x \hat{x}+n_y p_y \hat{y})=e^{ik_\rho^{inc}\cdot(n_x p_x \hat{x}+n_y p_y \hat{y})}\nabla \times E(r) \quad (5)$$

where $k_\rho^{inc} = k_0 (\sin\theta \cos\phi \hat{x} + \sin\theta \sin\phi \hat{y})$, and $\theta$ and $\phi$ are the incidence angle and the azimuth angle, respectively. In equation (5), $\rho$ indicates that the x and y directions are considered. Providing the 3D model may also involve defining continuity conditions at the interfaces at $\Gamma_{in}$ and $\Gamma_{out}$ in FIG. 8 (e.g., input and output ports). For example, the electric fields above ($E^+$) and below ($E^-$) an interface satisfy the following continuity conditions in equations (6) and (7):

$$\hat{z} \times E^+ = \hat{z} \times E^- \quad (6)$$

$$\hat{z} \times \nabla \times E^+ = \hat{z} \times \nabla \times E^- \quad (7)$$

The Rayleigh expansion may be used to impose the conditions defined above in equations (6)-(7) as in the following equations (8) and (9):
At the input interface, $$\hat{z} \times \nabla \times E = \hat{z} \times \left[ 2(\overline{\overline{E}}_{00} \cdot E_\rho^{inc}) e^{-ik_{z00}^{in} z^{in}} - \sum_{m,n} \frac{e^{i(k_{xm}x + k_{yn}y)}}{p_x p_y} \overline{\overline{E}}_{mn} \cdot \int_\Gamma E^{-i(k_{xm}x + k_{yn}y)} dS \right] \quad (8)$$

where m is the index in the x direction, n is the index in the y direction, $$\overline{\overline{E}}_{mn} = -\frac{i}{k_{zmn}} \begin{bmatrix} -k_{xm}k_{yn} & k_{xm}^2 - k_0^2 \\ k_0^2 - k_{yn}^2 & k_{xm}k_{yn} \end{bmatrix}, E_\rho^{inc} = \overline{E}_\rho^{inc} e^{i(k_{xm}x + k_{yn}y)},$$

$$k_{xm} = k_0 \sin\theta\cos\phi + \frac{2m\pi}{p_x}, k_{yn} = k_0 \sin\theta\sin\phi + \frac{2n\pi}{p_y}, \text{ and}$$

$$k_{zmn} = \sqrt{k_0^2 - k_{xm}^2 - k_{yn}^2}.$$

Similarly at the output interface, $$\hat{z} \times \nabla \times E = \hat{z} \times$$

$$\left[ \sum_{m,n} \frac{e^{i(k_{xm}x + k_{yn}y)}}{p_x p_y} (\overline{I} - \overline{\overline{R}}_{mn} e^{2ik_{zmn}^{out} z^{out}}) \cdot \right. \quad (9)$$

$$\left. \overline{\overline{E}}_{mn} \cdot (\overline{I} + \overline{\overline{R}}_{mn} e^{2ik_{zmn}^{out} z^{out}})^{-1} \cdot \int_\Gamma E e^{-i(k_{xm}x + k_{yn}y)} dS \right]$$

where $\overline{\overline{R}}_{mn}$ is the reflection coefficient matrix at the interface where the first grating layer (counting from the bottom) starts and is known, and $\overline{I}$ is the unit dyadic.

After providing the model, the method 300B involves discretizing the model into a 3D spatial mesh, at block 324. The mesh may be given by equation (10):

$$\Omega = \sum_i \Omega_i \quad (10)$$

where i is the number of elements in the mesh.

The method 300B then involves approximating 3D fields for each element of the 3D mesh using 3D spatial basis functions. For example, if the fields are expanded in terms of basis functions $N_j$, then the electric fields in the 3D diffracting structure may be given by equation (11):

$$E = \sum_j e_j N_j \quad (11)$$

where j in equation (11) is the number of basis functions in a given element of the mesh used to approximate the fields in the 3D structure, and $e_j$ is the coefficient of the jth basis function. In one embodiment, the method 300B then involves determining a weak formulation of an expression of the 3D fields in a given element of the 3D spatial mesh. The weak formulation may include the 3D spatial basis functions for the given element. For example, the weak formulation after incorporating the above boundary conditions (8)-(9) and basis functions as defined in equation (11) reads:

$$\int_{\Omega_i} \left( \sum_j e_j \nabla \times N_j \cdot \nabla \times N_i^* - k^2 \sum_j e_j N_j \cdot N_i^* \right) dV - \quad (12)$$

$$\sum_{m,n,j} \hat{z} \times \frac{\overline{\overline{E}}_{mn} \cdot \tilde{N}_{jmn}}{p_x p_y} \cdot \tilde{N}_{imn}^* e_j \Big|_{\Gamma^{in}} -$$

$$\sum_{m,n,j} \hat{z} \times \left[ \frac{(\overline{I} - \overline{\overline{R}}_{mn} e^{2ik_{zmn}^{out} z^{out}}) \cdot \overline{\overline{E}}_{mn} \cdot}{p_x p_j} \cdot \tilde{N}_{jmn} \right] \cdot \tilde{N}_{imn}^* e_j \Big|_{\Gamma^{out}} =$$

$$-\hat{z} \times 2 e^{-ik_{z00}^{in} z^{in}} (\overline{\overline{E}}_{00} \cdot \overline{E}_\rho^{inc}) \cdot \tilde{N}_{i00}^* \Big|_{\Gamma^{in}}$$

where i is the element of the mesh, $\tilde{N}_{jimn} = \int_{\Gamma_j} N_j e^{-i(k_{xm}x + k_{yn}y)} dS$ and $\Gamma^S$ includes all the periodic surfaces. The essential boundary conditions at the periodic boundaries can be imposed in strong form.

According to the embodiment illustrated in FIG. 3B, approximating the 3D fields involves approximating first 3D fields for a first element of the 3D spatial mesh on one periodic boundary using one or more first spatial functions, at block 326. The method 300B then involves approximating second 3D fields for a second element of the 3D spatial mesh on an opposite periodic boundary with one or more second spatial basis functions, at block 328. In one embodiment, the one or more second spatial basis functions are the one or more first spatial basis functions multiplied by a phase shift factor. The phase shift factor may be, for example, a function of the angle of incident light and the pitch in one or more directions of periodicity. For example, according to one embodiment, the periodic basis (testing) functions $N_j$ are constructed by multiplying the basis (testing) functions associated with one of the two corresponding periodic boundaries by the phase shift factor $e^{ik_\rho^{inc} \cdot (n_x p_x \hat{x} + n_y p_y \hat{y})}$ in equations (4) and (5). In one such embodiment, the surface integrals associated with the periodic boundaries may be eliminated.

Finally a system equation in the matrix-vector form can be obtained. For example, the method 300B involves generating a matrix, A, including coefficients of the 3D spatial functions at block 330, as in the following equation (13):

$$[A]\{e\} = \{e_\rho^{inc}\} \quad (13)$$

The method 300B then involves computing the coefficients of the 3D spatial functions of equation (13), at block 332, and computing spectral information based on the computed coefficients, at block 334. For example, after solving equation (13) for the total fields {e}, the reflected fields and hence the reflectivities can be obtained from the total fields {e} when accounting for the incident fields {e$_\rho^{inc}$}. A spatial solver may be used, which, as mentioned above, can enable flexibility in accepting different forms of illumination. For example, the illumination can be multi-wavelength, either collimated or uncollimated, or angle-resolved. The computed spectral information may then be compared to measured spectral information to determine how to adjust the model, at block 336, and to determine characteristic of the diffracting structure once a good model fit is obtained, at block 338. Using spatial solvers may provide clear information of local field distribution, which can be helpful for visually identifying the most "sensitive" parameters and optimizing the model used in regression (e.g., which parameters to be floated/fixed).

Figure 3C:
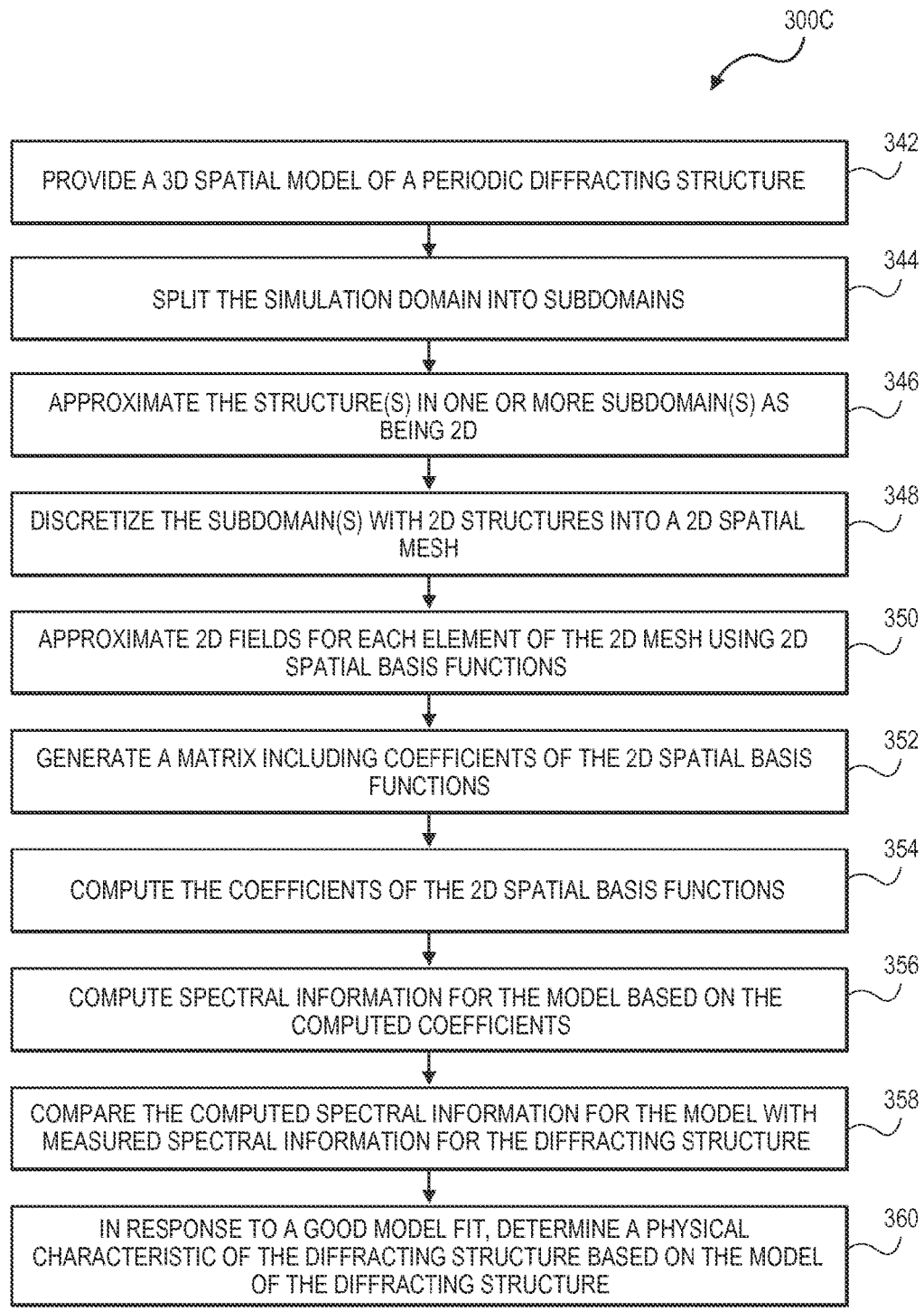
FIG. 3C is a flow diagram illustrating a method for evaluating a periodic diffracting structure involving finite element analysis and domain decomposition, in accordance with an embodiment of the invention.

FIG. 3C illustrates another exemplary method for evaluating a 3D periodic diffracting structure using domain decomposition and a finite element method. The method 300C may be useful when the structure is considered to be periodic in one direction in the wafer plane and the illumination is out of the grating plane (e.g., conical illumination). The method 300C may also be useful for evaluating structures such as, for example, gratings that consist of films and 2D and 3D structures. In the example illustrated in FIG. 6A, which depicts a FinFET 600A, a 3D structure 606 is sandwiched between two 2D structures 605 and 607, which are placed at right angles. Some existing methods treat 2D gratings as 3D gratings and do not take advantage of the repetitiveness of the structure. If such 2D structures are treated as ordinary 3D structures, unnecessary unknowns may be introduced. The same observations may be seen with the films in 3D structures, such as in FIG. 6B. In FIG. 6B, a 3D structure 600B includes a film stack 612, and a hole 610 in the film stack 612. According to embodiments, if there are some repetitive structures in the vertical direction (e.g., as in the film stack 612 of FIG. 6B), the system matrix of these structures can be generated and factorized only once (e.g., for one period), and then reused for each of the repetitive structures (e.g., used for the other periods in the periodic structure).

Embodiments such as the method 300C include a domain decomposition (DD) scheme, which enable optimization for grating analysis when the structure has films and 2D gratings sandwiched in 3D gratings or vice versa, or has repetitive structures in the vertical direction. The method 300C may also enable efficient forward simulation when the structure has repetitive structures in the horizontal plane. In one such embodiment, the spot is large but the number of periods is not large (e.g., as in FIG. 4B) or the spot is not large and spans only several periods (e.g., as in FIG. 4C), and therefore the structures are treated as aperiodic (or finite periodic). The method 300C can utilize the repetitiveness to achieve efficiency in speed and memory usage.

Referring to FIG. 3C, like the method 300A of FIG. 3A and the method 300B of FIG. 3B, the method 300C begins with providing a model of the 3D diffracting structure at block 342. However, before discretizing the model of the 3D diffracting structure into elements, the simulation domain is split into subdomains (e.g., in the vertical direction and/or horizontal), at block 344. For example, for a structure with a grating of posts (similar to FIG. 5A), a single subdomain could include a single post, such as illustrated in FIG. 8. The 3D subdomain 800 (referred to as Ω in FIG. 8) includes the post 802 over a film 808. However, a structure may be divided into subdomains differently than the example in FIG. 8. For example, a subdomain may be larger and include multiple posts and/or films, or smaller and include only a portion of the post and/or film. In FIG. 8, the subdomain 800 has an input interface (referred to as $\Gamma_{in}$) 806 and an output interface (referred to as $\Gamma_{out}$) 804. As is explained in more detail below, the method 300C may involve determining an expression for the 3D fields wherein, first incident fields on a first subdomain are fields from the incident light, and second incident fields on a second subdomain are the scattered fields from the first subdomain. For example, incident fields enter a given subdomain at an input interface, and scattered fields leave the subdomain at an output interface. Accordingly, in the following computations, the fields in each subdomain are under some incidence at the upper and lower interfaces of a given subdomain. At each iteration, the incidence is updated. Referring to FIG. 9, at the interface of two adjacent subdomains 902 and 904, the scattered fields (e.g., $E_{sca,i}$) from one subdomain, i (902), are the incident fields (e.g., $E_{inc,j}$) of the other subdomain, j (904). The expression for the 3D fields may be a summation of Fourier series expansion terms of the first incident fields over a first incidence interface of the first subdomain, and the second incident fields over a second incidence interface of the second subdomain. For 3D subdomains, the incident fields may be imposed using equation (14):

$$\hat{z} \times \nabla \times E = \hat{z} \times \sum_{m,n} e^{i(k_{xm}x+k_{yn}y)} \overline{\overline{E}}_{mn} \cdot \left[ 2\tilde{E}_{mn}^{inc} e^{-ik_{zmn}^{in} z^{in}} - \frac{1}{p_x p_y} \int_\Gamma E e^{-i(k_{xm}x+k_{yn}y)} dS \right] \quad (14)$$

where $$\tilde{E}_{mn}^{inc} = \frac{1}{p_x p_y} \int_\Gamma E^{inc} e^{-i(k_{xm}x+k_{yn}y)} dS \text{ and } E^{inc}$$

denotes the incident fields onto the subdomain.

In the first subdomain (e.g., counting from the top), the incident fields at the top interface are the real incident fields and are imposed by equation (8). In the last subdomain, the transparent boundary condition may be defined by equation (9). A higher convergence rate may be achieved by using spatial subdomain basis functions.

According to one embodiment, such as where the diffracting structure has at least one subdomain with a 2D structure, the method 300C may involve approximating the 2D fields in that subdomain, at operation 346. For example, the method may involve expressing first 2D fields in a direction perpendicular to a plane where the 2D structure resides as scalar fields in a scalar Helmholtz equation. Second 2D fields in the other directions may then be derived from the first 2D fields via differentiations. For example, for 2D structures (without loss of generality, suppose a 2D structure is in the XOZ plane), according to one embodiment, the fields may satisfy the following scalar Helmholtz equation (15):

$$\nabla_s^2 \Phi + k_{sn}^2 \Phi = 0, \ \Phi = E_{yn} \text{ or } H_{yn} \quad (15)$$

where $k_{sn}^2 = k^2 - k_{yn}^2$. The fields in the XOZ plane can be obtained from equations (16) and (17):

$$E_{sn} = \frac{i}{k_{sn}^2} (k_{yn} \nabla_s E_{yn} + \omega \mu \nabla_s \times \hat{y} H_{yn}) \quad (16)$$

-continued $$H_{sn} = \frac{i}{k_{sn}^2}(k_{yn}\nabla_s H_{yn} + \omega\varepsilon\nabla_s \times \hat{y}E_{yn}) \quad (17)$$

where $\nabla_s = \hat{x}\frac{\partial}{\partial x} + \hat{z}\frac{\partial}{\partial z}$.

In one embodiment, the method 300C involves determining boundary conditions for the 2D spatial model. Determining boundary conditions may involve, for example, determining a relationship between the 2D fields on opposite periodic boundaries. For example, the expression may include the scalar fields in the direction perpendicular to the plane where the 2D structure resides, and a phase shift factor. The subdomain(s) with the 2D structures may then be discretized into a 2D spatial mesh, at block 348. The 2D fields for each element of the 2D mesh may then be approximated using 2D spatial basis functions, at block 350. In one such example, the quasi-periodic boundary conditions may be expressed as in equations (18) and (19):

$$E_{yn}(r+p_x\hat{x}) = e^{ik_x^{inc}p_x}E_{yn}(r) \quad (18)$$

$$H_{yn}(r+p_x\hat{x}) = e^{ik_x^{inc}p_x}H_{yn}(r) \quad (19)$$

In one embodiment, approximating the 2D fields in the 2D structure further involves determining a weak formulation of an expression of the 2D fields. The weak formulation may include the 2D spatial basis functions approximating the 2D fields. In one example, the weak formulations for $E_{yn}$ and $H_{yn}$ are in the following form:

$$\int_\Omega (\nabla\Phi\cdot\nabla\Psi - k_{sn}^2\Phi\Psi)dS - \int_\Gamma \hat{n}\cdot\nabla\Phi\Psi dl = 0 \quad (20)$$

where $\Phi$ is the shape function, $\Psi$ is the weighting function, $\Phi, \Psi \in H^1(\Omega)$, l is the contour length, dl is the arc differential along the contour, and $\Gamma$ includes the periodic boundaries and the input interfaces. The quasi-periodic boundary conditions (18) and (19) are enforced in strong form. According to embodiments, the basis functions and testing functions are periodic. Periodic basis and testing function may be constructed by introducing the phase shift factor due to the quasi-periodicity to the ordinary basis and testing functions, as described above. After introducing the periodic basis and testing functions, the line integral in equation (20) vanishes.

The method 300C further involves generating a matrix including coefficients of the 2D spatial basis functions, at block 352. For example, generating the matrix may involve determining, at an input port of the one subdomain, a relationship amongst the scalar fields in the direction perpendicular to the plane where the 2D structure resides. For example, at the input ports, $$\hat{n} \cdot \nabla\Phi = \frac{\partial\Phi}{\partial z}$$

and can be derived from equations (16) and (17) as in the following equations (21) and (22):

$$\frac{\partial H_{yn}}{\partial z} = \frac{1}{\omega\mu}\left(k_{yn}\frac{\partial E_{yn}}{\partial x} + ik_{sn}^2 E_{xn}\right) \quad (21)$$

$$\frac{\partial E_{yn}}{\partial z} = -\frac{1}{\omega\varepsilon}\left(k_{yn}\frac{\partial H_{yn}}{\partial x} + ik_{sn}^2 H_{xn}\right) \quad (22)$$

The method 300C may further involve determining a port boundary condition at the input port including a Fourier expansion of incident fields and reflected fields at the input port. For example, the port boundary condition at the input ports may be expressed as the following equation (23):

$$\hat{n} \times H_n = \hat{n} \times \sum_m e^{ik_{xm}x}\overline{\overline{T}}_{mn} \cdot \left(2\tilde{E}_{mn}^{inc}e^{-ik_{zmn}z} - \frac{1}{p_x}\int_0^{p_x}e^{-ik_{xm}x}E_n dx\right) \quad (23)$$

where $\overline{\overline{T}}_{mn} = \frac{-1}{\omega\mu_0 k_{zmn}}\begin{bmatrix} -k_{xm}k_{yn} & k_{xm}^2 - k_0^2 \\ k_0^2 - k_{yn}^2 & k_{xm}k_{yn} \end{bmatrix}$ and $$\tilde{E}_{mn}^{inc} = \frac{1}{p_x p_y}\int_0^{p_x}\int_0^{p_y} E^{inc}e^{-i(k_{xm}x+k_{yn}y)}dxdy.$$

The method 300C may then involve determining a system equation expressing the relationship amongst the scalar fields in the direction perpendicular to the plane where the 2D structure resides in matrix-vector form from testing. For example, substituting (21) and (22) into (20) and after testing equation (20), we have $$Ae_{yn} + Bh_{xn} = 0 \quad (24)$$

$$Ch_{yn} + De_{xn} = 0 \quad (25)$$

where A, B, C, and D are the matrices from testing. The method may then involve determining a matrix-vector equation that includes total fields and the incident and the reflected fields at an incidence interface between the one subdomain and a neighboring subdomain. For example, after testing on equation (23), we have:

$$\begin{Bmatrix} h_{xn} \\ h_{yn} \end{Bmatrix} = \begin{Bmatrix} h_{xn}^{inc} \\ h_{yn}^{inc} \end{Bmatrix} + G\begin{Bmatrix} e_{xn} \\ e_{yn} \end{Bmatrix} \quad (26)$$

where G is the matrix from testing. The fields $e_{xn}$ and $h_{xn}$ can be written in terms of $e_{yn}$ and $h_{yn}$ and the incident fields based on equation (26). Substituting $e_{xn}$ and $h_{xn}$ into (24) and (25), $e_{yn}$ and $h_{yn}$ can be solved for. Thus, the method may involve computing coefficients of the 2D spatial basis functions, at block 354, and spectral information (e.g., the scattered fields) can then be obtained based on the computed coefficients, at block 356. After computing spectral information for the model, the method 300C involves comparing the computed spectral information for the model with measured spectral information for the diffracting structure, at block 358. If the model is a good fit, the method 300C involves determining a physical characteristic of the diffracting structure based on the model of the diffracting structure, at block 360.

Thus, according to embodiments, when solving for the fields, the prescribed boundary conditions are imposed on the interfaces between periods. Then the field distributions within each period may be solved for, and the boundary conditions at the interfaces between periods can be updated. This process may be repeated until the boundary fields converge. According to embodiments, the most computationally expensive operation in the method is the system matrix factorization. A scheme such as the method 300C may exploit the structure repetitiveness and only a submatrix is factorized, thus resulting in savings on computation time and memory. Therefore, the method 300C can enable improvements in computation speed and memory consumption based on repetitiveness in one or more directions (e.g., in the vertical direction and/or in the horizontal plane).

Although the method 300C is described in the context of a 3D diffracting structure, the method 300C may also be used for purely 2D structures under conical illumination. As mentioned above, in some existing methods, the 2D gratings are treated as 3D gratings, and therefore the methods use a 3D scheme and lose efficiency. According to one embodiment, a 2D scheme for scattering from 2D gratings may provide efficient simulation when the structure is considered to be periodic in one direction in the wafer plane and the illumination is out of the grating plane (e.g., conical illumination such as depicted in FIG. 7). In one such embodiment, the y-component of the reciprocal space in the equations above contains $h_{y0}$ only.

In another embodiment in which the 3D structure includes films, the incident fields may be Fourier transformed prior to solving for the fields in a given subdomain. For each Fourier component, the scattered and transmitted fields under the illumination at an input port may be computed analytically. In an embodiment with two input ports, the analytical computation of scattered and transmitted fields is executed twice, and linear superposition is applied to obtain the total scattered fields from each port. In one such embodiment, the maximum wavenumber in the Fourier transform and the number of Fourier modes may be determined from the maximum mesh size in the adjacent 3D subdomain.

Figure 3D:
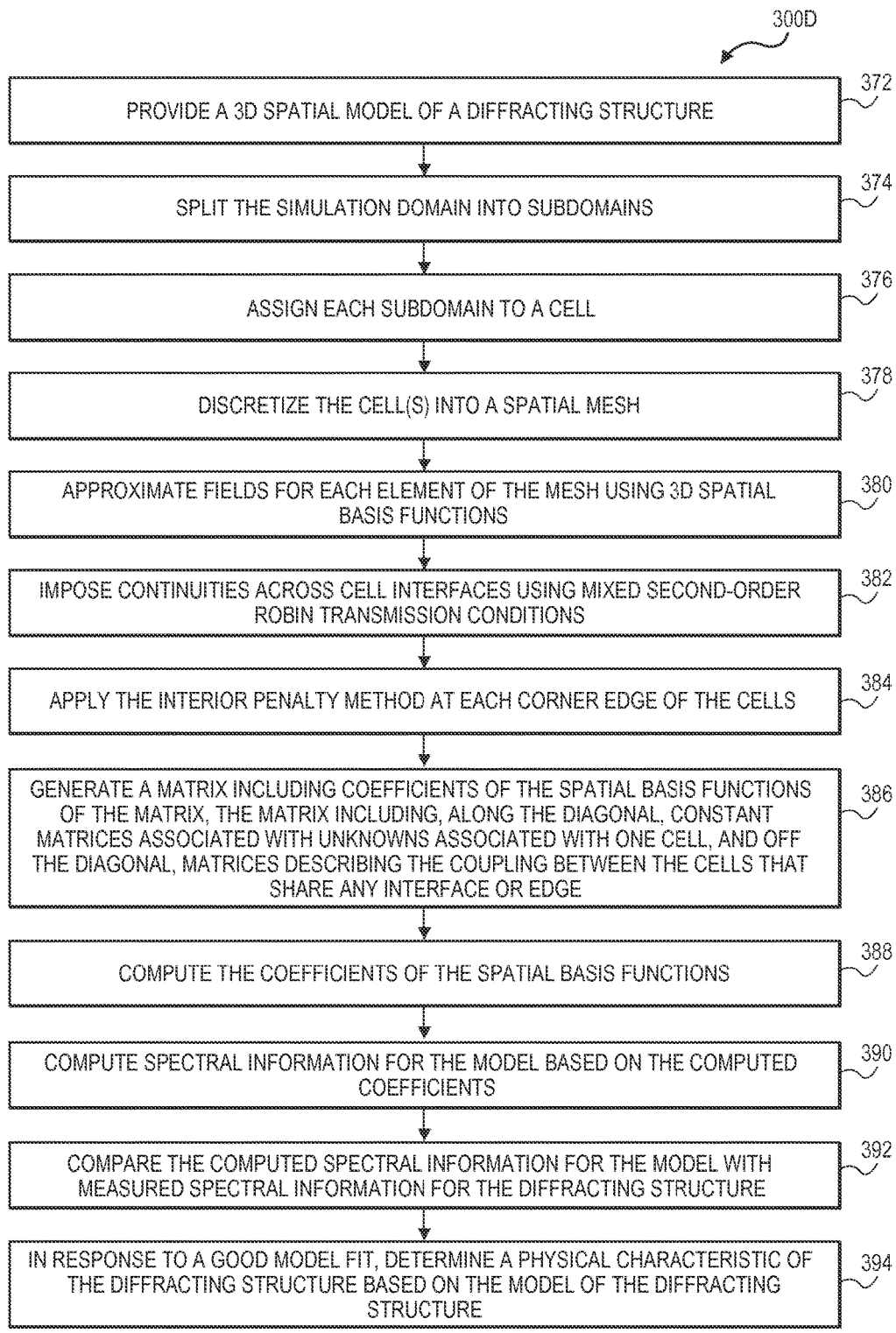
FIG. 3D is a flow diagram illustrating a method for evaluating an aperiodic diffracting structure involving finite element analysis and domain decomposition, in accordance with an embodiment of the invention.

FIG. 3D illustrates another exemplary method for evaluating a 3D periodic diffracting structure using domain decomposition and a finite element method. The method 300D of FIG. 3D may be useful for evaluating, for example, aperiodic structures (e.g., as in FIGS. 4D and 4E) or "finite periodic" structures (e.g., structures that are periodic, but which may be treated as aperiodic). Finite periodic structures include periodic structures that have repetitive structures (e.g., in the horizontal plane) that are illuminated with a spot size that is not large, such that it spans across only several periods (e.g., as in FIG. 4C). Another example of a finite periodic structure is a target that has only several periods (although the spot size may be large). Although the finite periodic and aperiodic structures may lack the repetitiveness described above with respect to FIGS. 3A-3C, the method 300D can still can reduce the memory consumption and computer time to some extent, according to embodiments. In some embodiments, (e.g., 2D BPR), the incidence is no longer a plane wave and is nonuniformly distributed on the aperture. Moreover, the fields over several periods may need to be accounted for to obtain accurate enough far-field results. Therefore the simulation domain consists of many repetitive cells. The method 300D may involve a non-conformal domain decomposition method to utilize the repetitions. According to one embodiment, the method 300D of FIG. 3D includes a finite element tearing and interconnecting (FETI)-like algorithm, Robin transmission conditions, and edge corner penalty.

Referring to FIG. 3D, like the methods 300A-300C of FIGS. 3A-3C, the method 300D begins with providing a model of the 3D diffracting structure at block 372. At block 374, the entire simulation domain is split into subdomains. In one embodiment, each subdomain is assigned to one cell, at block 376. Therefore the solution domain may be given by $\Omega = \Omega_1 \cup \Omega_2 \ldots \cup \Omega_{M \times N}$ for an M by N cell array. For example, FIG. 10 shows the entire simulation domain being split into 9 subdomains ($\Omega_1$-$\Omega_9$) and assigned to a 3 by 3 cell array. Therefore, the solution domain in such an embodiment may be given by $\Omega = \Omega_1 \cup \Omega_2 \ldots \cup \Omega_9$. According to one embodiment, the cells are then discretized into a spatial mesh, at block 378. Discretizing the cells into a 3D mesh may involve meshing one cell, then copying the mesh the other cells in the solution domain. The fields in each element of the mesh may be described by one or more basis functions, at block 380, which may be similar or the same as the basis functions described above with reference to the methods of FIGS. 3A-3C. In one embodiment the basis functions are curl-conforming.

According to one embodiment, within each subdomain, the electrical fields satisfy the following equation:

$$\nabla \times \nabla \times E_m - k_m^2 E_m = i \omega \mu_0^2 J_m^{imp} \tag{27}$$

where $J_m^{imp}$ is the impressed current density.

At block 382, mixed second-order Robin transmission conditions (SOTCs) may be used to impose the continuities across subdomain interfaces. Providing the 3D spatial model of the diffracting structure may involve determining auxiliary surface variables. For example, the following set of auxiliary surface variable equations (28)-(30) may be introduced. Equations (28)-(30) represent auxiliary tangential electric fields, auxiliary tangential current density, and auxiliary electric charge density, respectively, at subdomain interfaces:

$$e_m = \hat{n}_m \times E_m \times \hat{n}_m \tag{28}$$

$$j_m = \frac{1}{k_0} \hat{n}_m \times \mu_{rm}^{-1} \nabla \times E_m \tag{29}$$

$$\rho_m = \frac{1}{k_0} \nabla_\tau \cdot j_m = \frac{1}{k_0^2} \nabla_\tau \cdot \hat{n}_m \times \mu_{rm}^{-1} \nabla \times E_m \tag{30}$$

The equations (28)-(30) are defined on the interior interface $\Gamma_{mn}$ of $\Omega_m$. Imposing continuities across the subdomain interfaces using the mixed second-order Robin transmission conditions may involve determining field continuity at the subdomain interfaces including addressing convergence of both transverse electric (TE) and transverse magnetic (TM) evanescent modes. For example, the SOTCs can then be written as in equations (31) and (32):

$$k_0 j_m + \alpha e_m + \beta_m \nabla_\tau \times \nabla_\tau \times e_m + \gamma_m k_0^2 \nabla_\tau \rho_m = -k_0 j_n + \alpha e_n + \beta_m \nabla_\tau \times \nabla_\tau \times e_n - \gamma_m k_0^2 \nabla_\tau \rho_n \tag{31}$$

on $\Gamma_{mn}$ and $$k_0 j_n + \alpha e_n + \beta_n \nabla_\tau \times \nabla_\tau \times e_n \gamma_n k_0^2 \nabla_\tau \rho_n = -k_0 j_m + \alpha e_m + \beta_n \nabla_\tau \times \nabla_\tau \times e_m - \gamma_m - \gamma_m k_0^2 \nabla_\tau \rho_m \tag{32}$$

on $\Gamma_{nm}$, where $\alpha$, $\beta_m$, $\beta_n$, $\gamma_m$, and $\gamma_n$ are parameters that can be adjusted to make the amplitude of the eigenvalues of the preconditioned system matrix <1. The values of $\alpha$, $\beta_m$, $\beta_n$, $\gamma_m$, and $\gamma_n$ may be based on factors such as the wavenumber, the order of the basis functions, and the mesh size. Judicious selection of $\alpha$, $\beta_m$, $\beta_n$, $\gamma_m$, and $\gamma_n$ can accelerate the convergence.

Figure 11:
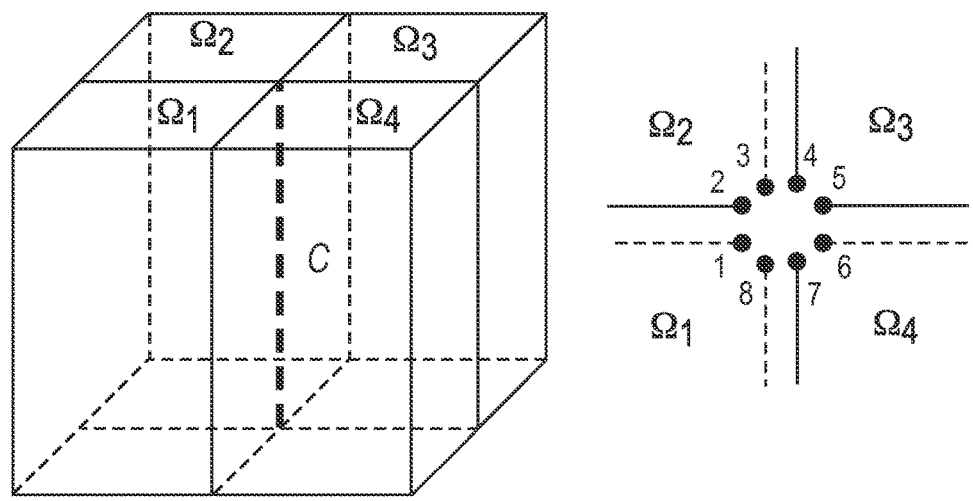
FIG. 11 illustrates corner edge interfaces of subdomains of a model of a diffracting structure, which may be used in evaluating the diffracting structure in accordance with embodiments of the invention.

According to one embodiment, the interior penalty method is applied to ensure the divergence-free condition at each corner edge (e.g., $\nabla \cdot B = 0$, where B is magnetic flux density), at block 384. In the current decomposition, the angle between adjacent subdomains around the common edge is equal ($\pi/2$) (e.g., as in FIG. 11). FIG. 11 illustrates the interfaces of four subdomains ($\Omega_1$-$\Omega_9$) which have corners that meet at C. Therefore, in the example illustrated in FIG. 11, we have:

$$\sum_{m=1}^{8} (-1)^m j_m = 0 \tag{33}$$

Providing the 3D spatial model of the diffracting structure may further involve determining a weak formulation of an expression of the 3D fields in a given element of the 3D mesh. The weak formulation may include a tested Helmholtz equation subject to excitation and under boundary conditions at the subdomain interfaces and tested Robin transmission conditions at the cell interfaces that touch each other. For example, when solving equations (30), (31), and (32) using a finite element method, the following weak forms may be obtained:

$$\int_{\Omega_m} (\nabla \times W_m \cdot \nabla \times E_m - k_m^2 W_m \cdot E_m) dV + \\ k_0^2 \mu \int_{\Gamma_{mn}} W_m \cdot j_m dS = i\omega \mu_0^2 \int_{\Gamma_{mn}} W_m \cdot J_m^{imp} dS \quad (34)$$

$$k_0 \int_{\Gamma_{mn}} w_m \cdot j_m dS + \alpha \int_{\Gamma_{mn}} w_m \cdot e_m dS + \beta_m \int_{\Gamma_{mn}} \nabla_\tau \times w_m \cdot \nabla_\tau \times \\ e_m dS + \gamma_m k_0^2 \int_{\Gamma_{mn}} w_m \cdot \nabla_\tau \rho_m dS = -k_0 \int_{\Gamma_{mn}} w_m \cdot j_n dS + \\ \alpha \int_{\Gamma_{mn}} w_m \cdot e_n dS + \beta_m \int_{\Gamma_{mn}} \nabla_\tau \times w_m \cdot \nabla_\tau \times e_n \\ dS - \gamma_m k_0^2 \int_{\Gamma_{mn}} w_m \cdot \nabla_\tau \rho_n dS \quad (35)$$

$$k_0 \int_{\Gamma_{nm}} w_n \cdot j_n dS + \alpha \int_{\Gamma_{nm}} w_n \cdot e_n dS + \beta_n \int_{\Gamma_{nm}} \nabla_\tau \times w_n \cdot \nabla_\tau \times e_n dS + \\ \gamma_n k_0^2 \int_{\Gamma_{nm}} w_n \cdot \nabla_\tau \rho_n dS = -k_0 \int_{\Gamma_{nm}} w_n \cdot j_m dS + \\ \alpha \int_{\Gamma_{nm}} w_n \cdot e_m dS + \beta_n \int_{\Gamma_{nm}} \nabla_\tau \times w_n \cdot \nabla_\tau \times e_m \\ dS - \gamma_n k_0^2 \int_{\Gamma_{nm}} w_n \cdot \nabla_\tau \rho_m dS \quad (36)$$

where $W_m$ is a weighting function such that $W_m, E_m \in H(\text{curl}, \Omega_m)$, $e_m, j_m, w_m \in H(\text{curl}_\Gamma, \Gamma_{mn})$, and $e_n, j_n, w_n \in H(\text{curl}_\Gamma, \Gamma_{nm})$.

Providing the 3D spatial model of the diffracting structure may involve determining a tested equation of continuity at the cell interfaces that touch each other. For example, after being tested, equation (30) may be expressed as equations (37) and (38):

$$\int_{\Gamma_{mn}} \rho_m \psi_m dS + \frac{1}{k_0} \int_{\Gamma_{mn}} j_m \cdot \nabla_\tau \psi_m dS = 0 \quad (37)$$

$$\int_{\Gamma_{nm}} \rho_n \psi_n dS + \frac{1}{k_0} \int_{\Gamma_{nm}} j_n \cdot \nabla_\tau \psi_n dS = 0 \quad (38)$$

where $\rho_m, \psi_m \in H_0^{-1/2}(\Gamma_{mn})$ and $\rho_n, \psi_n \in H_0^{-1/2}(\Gamma_{nm})$.

Providing the 3D spatial model of the diffracting structure may further involve determining tested divergence conditions at the corners, C, where the cells meet. For example, after being tested using $W_m$, equation (33) becomes:

$$\sum_{m=1}^{8} (-1)^m \int_C j_m \cdot W_m dl = 0 \quad (39)$$

Generating the matrix with the coefficients of the 3D spatial basis functions may involve generating a matrix having, along the diagonal, constant matrices associated with unknowns associated with one cell, and off the diagonal, matrices describing coupling between the cells that share any interface or edge, at block 386. For example, the discrete system of equations (34)-(39) may be expressed in the following matrix-vector form:

$$\begin{bmatrix} A_1 & C_{12} & \cdots & C_{1M} \\ C_{21} & A_2 & \cdots & C_{2M} \\ \vdots & \vdots & \ddots & \vdots \\ C_{M1} & C_{M2} & \cdots & A_M \end{bmatrix} \begin{Bmatrix} x_1 \\ x_2 \\ \vdots \\ x_M \end{Bmatrix} = \begin{Bmatrix} y_1 \\ y_2 \\ \vdots \\ y_M \end{Bmatrix} \quad (40)$$

where $x_m$ is the matrix associated with the interior unknowns and is a constant across all subdomains, $C_{mn}$ is zero if subdomain m and subdomain n do not share any interface or edge, $x_m = \{E_m, e_m, j_m, \rho_m\}^T$, and $y_m$ includes the incidence upon the mth subdomain. The method 300D may then involve inverting one of the constant matrices along the diagonal, and constructing an iterative scheme that reuses the inverted matrices. For example, equation (40) can be written as:

$$(A+C)X=Y \quad (41)$$

where A consists of all the $A_m$'s. When solving equation (40), $A_m$ may first be inverted. Since $A_m$ is a constant, inversion of $A_m$ may be performed for only one subdomain. An iterative scheme can be expressed as equation (42):

$$X^{(i+1)} = Y - A^{-1}CX^{(i)} \quad (42)$$

Thus, the basis function coefficients may be solved for using equation (42), for example, at block 388. Similar to the methods 300A-300C described above, spectral information may be computed based on the basis function coefficients, at block 390. The modeled spectral information may be compared to measured spectral information to determine whether the model is a good fit, at block 392. Once a good model fit is determined, the model can be used to determine physical characteristics of the diffracting structure, at block 394.

Thus, an optical metrology system can use the methods described above with respect to FIGS. 3A, 3B, 3C, and 3D to evaluate a diffracting structure using a finite element method and/or domain decomposition.

Figure 12:
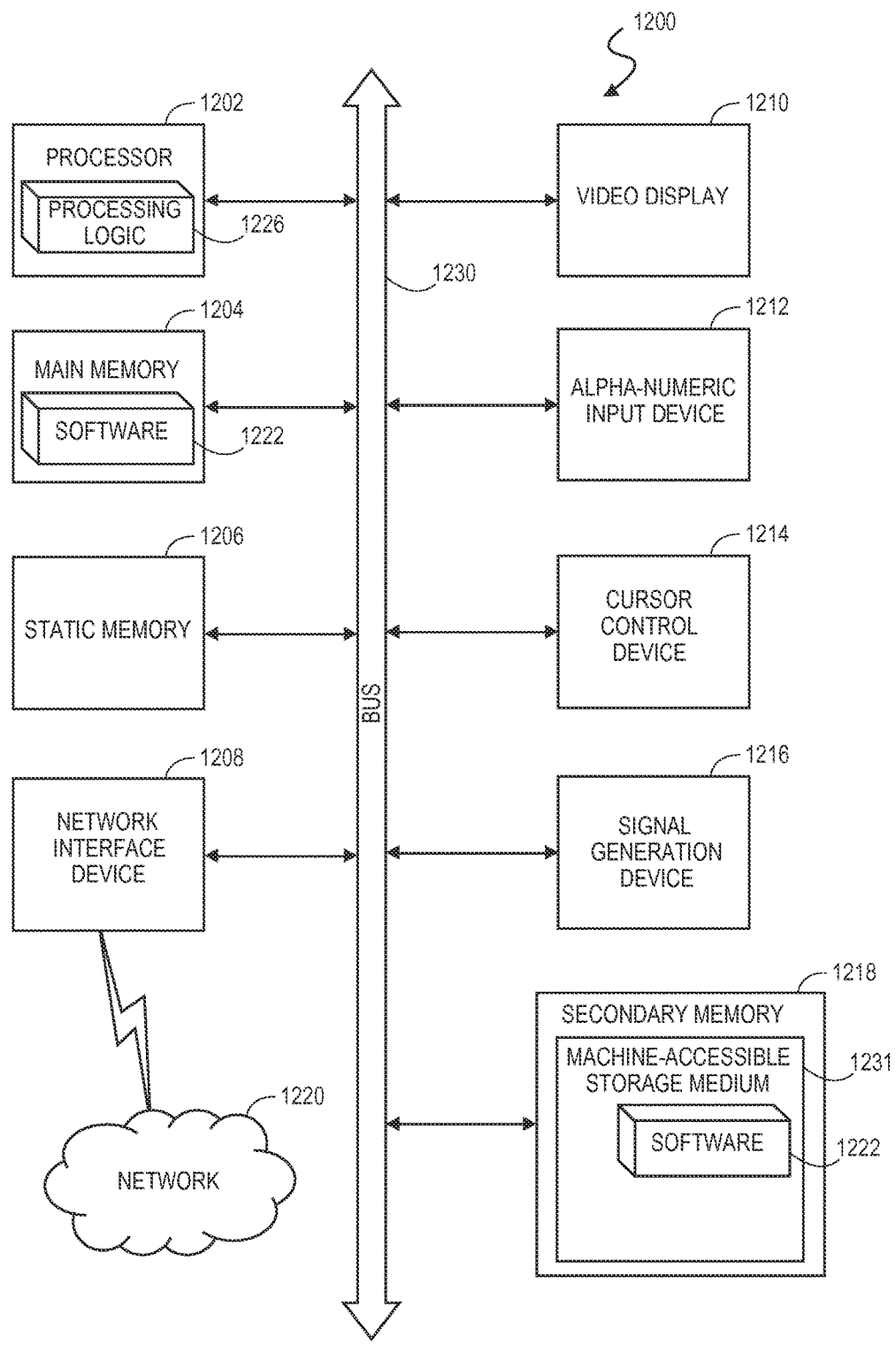
FIG. 12 illustrates a block diagram of an exemplary computing system in accordance with which embodiments may operate, be installed, integrated, or configured.

FIG. 12 illustrates a block diagram of an exemplary computing system in accordance with which embodiments may operate, be installed, integrated, or configured. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a server, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computing system 1200 includes a processor 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a secondary memory 1218 (e.g., a data storage device), which communicate with each other via a bus 1230.

Processor 1202 represents one or more general-purpose processing devices such as a microprocessor, central processing unit, or the like. More particularly, the processor 1202 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1202 may also be one or more special-purpose processing devices such as an application specific integrated circuit (ASIC), a field programmable gate array (FPGA), a digital signal processor (DSP), network processor, or the like. Processor 1202 is configured to execute the processing logic 1226 for performing the operations and steps discussed herein.

The computing system 1200 may further include a network interface device 1208. The computing system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), and a signal generation device 1216 (e.g., a speaker).

The secondary memory 1218 may include a machine-accessible storage medium (or more specifically a computer-readable storage medium) 1231 on which is stored one or more sets of instructions (e.g., software 1222) embodying any one or more of the methodologies or functions described herein. The software 1222 may also reside, completely or at least partially, within the main memory 1204 and/or within the processor 1202 during execution thereof by the computing system 1200, the main memory 1204 and the processor 1202 also constituting machine-readable storage media. The software 1222 may further be transmitted or received over a network 1220 via the network interface device 1208.

While the machine-accessible storage medium 1231 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media, as well as other similarly non-transitory media.

Figure 13:
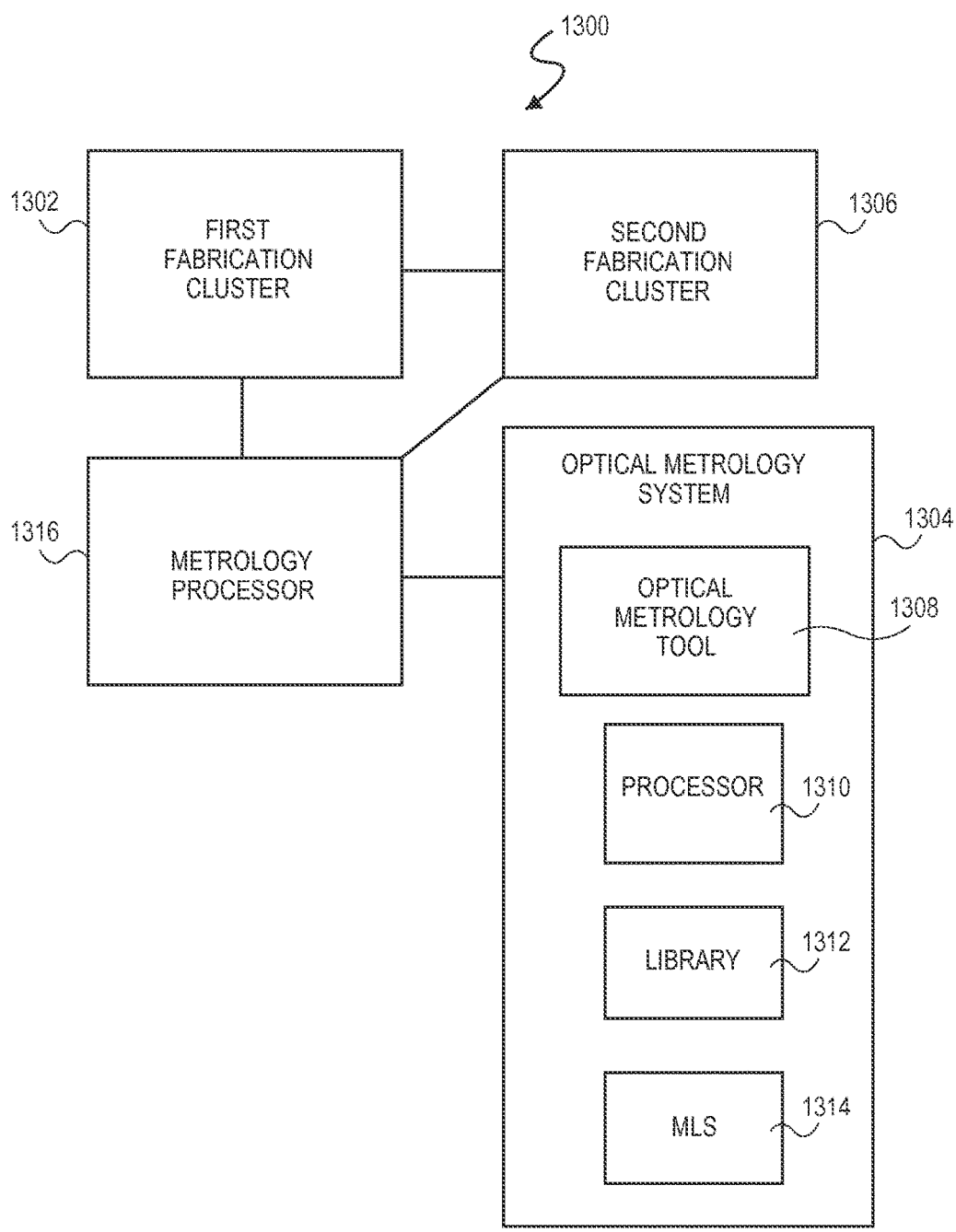
FIG. 13 is a block diagram illustrating select elements of a system according to an embodiment for determining and utilizing profile parameters for automated process and equipment control.

FIG. 13 is an exemplary block diagram of a system for determining and utilizing profile parameters for automated process and equipment control.

System 1300 includes a first fabrication cluster 1302 and an optical metrology system 1304 (e.g., an optical measurement system). The optical metrology system 1304 can include, for example, a spectroscopic ellipsometer (SE), a dual-beam spectrophotometer (DBS), a polarized DBS, a beam reflectometer, or any other optical measurement system. System 1300 also includes a second fabrication cluster 1306. Although the second fabrication cluster 1306 is depicted in FIG. 13 as being subsequent to the first fabrication cluster 1302, it should be recognized that the second fabrication cluster 1306 can be located prior to the first fabrication cluster 1302 in the system 1300 (e.g. and in the manufacturing process flow).

A photolithographic process, such as exposing and/or developing a photoresist layer applied to a wafer, can be performed using the first fabrication cluster 1302. In one exemplary embodiment, the optical metrology system 1304 includes an optical metrology tool 1308 and a processor 1310. The optical metrology tool 1308 is configured to measure a diffraction signal off of the structure. If the measured diffraction signal and the simulated diffraction signal match, one or more values of the profile parameters are presumed equal to the one or more values of the profile parameters associated with the simulated diffraction signal.

In one exemplary embodiment, the optical metrology system 1304 can also include a library 1312 with a plurality of simulated (e.g., computed) diffraction signals and a plurality of values of one or more profile parameters associated with the plurality of simulated diffraction signals. The library can be generated in advance. The processor 1310 can compare a measured diffraction signal of a structure to the plurality of simulated diffraction signals in the library. When a matching simulated diffraction signal is found, the one or more values of the profile parameters associated with the matching simulated diffraction signal in the library is assumed to be the one or more values of the profile parameters used in the wafer application to fabricate the structure.

The system 1300 also includes a metrology processor 1316. In one exemplary embodiment, the processor 1310 can transmit the one or more values of the one or more profile parameters to the metrology processor 1316. The metrology processor 1316 can then adjust one or more process parameters or equipment settings of the first fabrication cluster 1302 based on the one or more values of the one or more profile parameters determined using the optical metrology system 1304. The metrology processor 1316 can also adjust one or more process parameters or equipment settings of the second fabrication cluster 1306 based on the one or more values of the one or more profile parameters determined using the optical metrology system 1304. As noted above, the second fabrication cluster 1306 can process the wafer before or after the first fabrication cluster 1302. In another exemplary embodiment, the processor 1310 is configured to train a machine learning system 1314 using the set of measured diffraction signals as inputs to the machine learning system 1314 and profile parameters as the expected outputs of the machine learning system 1314.

One or more components of the system 1300 can include or implement embodiments of the invention as described herein. For example, in one embodiment the optical metrology system 1304 includes logic for receiving optical reflectance measurements for the diffracting structure. Logic for receiving measurements can be included in, for example, the optical metrology tool 1308. A processor (e.g., the processor 1310) can be configured to evaluate the diffracting structure according to a methods described herein.

For example, according to one embodiment, a processor (e.g., the processor 1310) is configured to evaluate the diffracting structure according to a method including: providing a 3D spatial model of the diffracting structure and discretizing the model into a 3D spatial mesh; approximating 3D fields for each element of the 3D mesh using 3D spatial basis functions; generating a matrix including coefficients of the 3D spatial basis functions approximating the fields; computing the coefficients of the 3D spatial basis functions; computing spectral information for the model based on the computed coefficients; comparing the computed spectral information for the model with measured spectral information for the diffracting structure; and in response to a good model fit, determining a physical characteristic of the diffracting structure based on the model of the diffracting structure.

Thus, embodiments described herein using spatial solvers can result in a high convergence rate and therefore can be efficient even when abrupt material discontinuities exist. Furthermore, when the spot size is small and the periodic assumption is invalid, methods involving domain decomposition can enable simulation of structures with many repetitive substructures using acceptable computer time and memory.

It is to be understood that the above description is intended to be illustrative, and not restrictive. Many other embodiments will be apparent to those of skill in the art upon reading and understanding the above description. Although the present invention has been described with reference to particular embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

What is claimed is:

1. A method of evaluating a diffracting structure utilizing an optical metrology system, the method comprising:
measuring spectral information for a diffracting structure, measuring the spectral information including illuminating the diffracting structure with an incident beam by a light source and detecting a resulting spectral signal with a detector of the optical metrology system; and
receiving and analyzing the measured signal by a processing module of the optical metrology system, including:
providing a three-dimensional (3D) spatial model of the diffracting structure in a simulation domain, the simulation domain being a spatial domain, providing the 3D spatial model including constructing a geometric model of the diffracting structure and determining how to parameterize the geometric model;
splitting the simulation domain into a plurality of subdomains;
discretizing the 3D spatial model into a 3D spatial mesh in the simulation domain;
approximating 3D fields for each element of the 3D spatial mesh using 3D spatial basis functions for each subdomain of the simulation domain;
generating a matrix comprising coefficients of the 3D spatial basis functions approximating fields in each subdomain of the simulation domain;
computing the coefficients of the 3D spatial basis functions using the matrix;
computing spectral information for the model based on the computed coefficients;
comparing the computed spectral information for the model with the measured spectral information for the diffracting structure; and
in response to a determination of a model fit by the processing module, determining a physical characteristic of the diffracting structure based on the model of the diffracting structure, the physical characteristic being a geometric or material characteristic of the diffracting structure,
wherein approximating the 3D fields for each element of the 3D spatial mesh comprises:
approximating first 3D fields for a first element of the 3D spatial mesh on one periodic boundary using one or more first spatial basis functions; and
approximating second 3D fields for a second element of the 3D spatial mesh on an opposite periodic boundary with one or more second spatial basis functions, wherein the one or more second spatial basis functions comprise the one or more first spatial basis functions multiplied by a phase shift factor, wherein the phase shift factor is a function of an angle of incident light and pitch in one or more directions of periodicity.

2. The method of claim 1, wherein providing the 3D spatial model of the diffracting structure comprises:
determining a weak formulation of an expression of the 3D fields in a given element of the 3D spatial mesh, the weak formulation including the 3D spatial basis functions for the given element.

3. The method of claim 2, wherein providing the 3D spatial model of the diffracting structure further comprises:
determining boundary conditions for the 3D spatial model; and
imposing the boundary conditions at periodic boundaries in strong form.

4. The method of claim 3, wherein determining the boundary conditions for the 3D spatial model comprises:
determining the expression for the 3D fields as a function of the angle of the incident light and the pitch in one or more directions of periodicity; and
determining continuity conditions at input and output interfaces of the simulation domain.

5. The method of claim 1, wherein providing the 3D spatial model of the diffracting structure further comprises:
determining an expression for the 3D fields wherein, in the expression, first incident fields on a first subdomain comprise fields from incident light, and second incident fields on a second subdomain comprise scattered fields from the first subdomain.

6. The method of claim 5, wherein the expression for the 3D fields is a summation of Fourier series expansion terms of the first incident fields over a first incidence interface of the first subdomain, and the second incident fields over a second incidence interface of the second subdomain.

7. The method of claim 6, wherein providing the 3D spatial model comprises approximating a structure in at least one subdomain as a 2D structure, and wherein approximating 2D fields in the one subdomain comprises:
expressing first 2D fields in a direction perpendicular to a plane where the 2D structure resides as scalar fields in a scalar Helmholtz equation; and
deriving second 2D fields in other directions from the first 2D fields via differentiations.

8. The method of claim 7, wherein approximating the 2D fields in the 2D structure further comprises:
determining a weak formulation of an expression of the 2D fields, the weak formulation including 2D spatial basis functions approximating the 2D fields.

9. The method of claim 8, wherein providing the 2D spatial model further comprises:
determining boundary conditions for the 2D spatial model; and
imposing the boundary conditions at periodic boundaries in strong form.

10. The method of claim 9, wherein determining the boundary conditions for the 2D spatial model comprises:
determining a relationship between the 2D fields on opposite periodic boundaries, the expression comprising the scalar fields in the direction perpendicular to the plane where the 2D structure resides and a phase shift factor.

11. The method of claim 9, wherein generating the matrix comprises:
determining, at an input port of the one subdomain, a relationship amongst the scalar fields in the direction perpendicular to the plane where the 2D structure resides;

determining a port boundary condition at the input port comprising a Fourier expansion of incident fields and reflected fields at the input port;

determining a system equation expressing the relationship amongst the scalar fields in the direction perpendicular to the plane where the 2D structure resides in matrix-vector form from testing; and determining a matrix-vector equation that comprises total fields and the incident and the reflected fields at an incidence interface between the one subdomain and a neighboring subdomain.

12. The method of claim 9, wherein the diffracting structure comprises films, the method further comprising:

computing Fourier components approximating incident fields onto one of the films, wherein a maximum Fourier transform wavenumber and a maximum number of Fourier modes is based on a maximum mesh size in an adjacent subdomain; and for each of the computed Fourier components, analytically computing the scattered and transmitted fields from the one of the films.

13. The method of claim 1, further comprising:

assigning each of the plurality of subdomains to a cell of a cell array.

14. The method of claim 13, wherein providing the 3D spatial model of the diffracting structure comprises:

determining auxiliary surface variables, the auxiliary surface variables comprising auxiliary tangential electric fields, auxiliary tangential current density, and auxiliary electric charge density at subdomain interfaces.

15. The method of claim 14, wherein providing the 3D spatial model of the diffracting structure further comprises:

imposing continuities across cell interfaces of the cell array using mixed second-order Robin transmission conditions.

16. The method of claim 15, wherein imposing continuities across the subdomain interfaces using the mixed second-order Robin transmission conditions comprises:

determining field continuity at the subdomain interfaces including addressing convergence of both TE and TM evanescent modes.

17. The method of claim 16, further comprising:

applying an interior penalty method at each corner edge of the cells of the cell array to which the plurality of subdomains are assigned, the penalty method to ensure a divergence-free condition at each corner edge.

18. The method of claim 17, wherein providing the 3D spatial model of the diffracting structure further comprises:

determining a weak formulation of an expression of the 3D fields in a given element of the 3D mesh, the weak formulation comprising a tested Helmholtz equation subject to excitation and under boundary conditions at the subdomain interfaces and tested Robin transmission conditions at the cell interfaces of the cell array that touch each other.

19. The method of claim 18, wherein providing the 3D spatial model of the diffracting structure further comprises:

determining a tested equation of continuity at the cell interfaces of the cell array that touch each other.

20. The method of claim 19, wherein providing the 3D spatial model of the diffracting structure further comprises:

determining tested divergence conditions at corners where the cells of the cell array meet.

21. The method of claim 20, wherein generating the matrix comprising the coefficients of the 3D spatial basis functions approximating the fields comprises:

generating the matrix comprising, along the diagonal, constant matrices associated with unknowns associated with one cell, and off the diagonal, matrices describing coupling between the cells of the cell array that share any interface or edge.

22. The method of claim 21, wherein computing the coefficients of the spatial basis functions of the matrix comprises:

inverting one of the constant matrices along the diagonal; and constructing an iterative scheme that reuses the inverted matrices.

23. The method of claim 1, wherein discretizing the model into a 3D spatial mesh comprises discretizing the model into curvilinear elements.

24. The method of claim 1, wherein splitting the simulation domain into the plurality of subdomains includes splitting the subdomains in one or more of a vertical direction or a horizontal direction.

25. A non-transitory machine-readable storage medium having instructions stored thereon which cause a computer to perform a method of evaluating a diffracting structure, the method comprising:

measuring spectral information for a diffracting structure, measuring the spectral information including illuminating the diffracting structure with an incident beam by a light source and detecting a resulting spectral signal with a detector of the optical metrology; and receiving and analyzing the measured signal by a processing module of the optical metrology system, including:

providing a 3D spatial model of the diffracting structure in a simulation domain, the simulation domain being a spatial domain, providing the 3D spatial model including constructing a geometric model of the diffracting structure and determining how to parameterize the geometric model;

splitting the simulation domain into a plurality of subdomains;

discretizing the model into a 3D spatial mesh in the simulation domain;

approximating 3D fields for each element of the 3D mesh using 3D spatial basis functions for each subdomain of the simulation domain;

generating a matrix comprising coefficients of the 3D spatial basis functions approximating fields in each subdomain of the simulation domain;

computing the coefficients of the 3D spatial basis functions using the matrix;

computing spectral information for the model based on the computed coefficients;

comparing the computed spectral information for the model with the measured spectral information for the diffracting structure; and in response to a determination of a model fit by the processing module, determining a physical characteristic of the diffracting structure based on the model of the diffracting structure, the physical characteristic being a geometric or material characteristic of the diffracting structure, wherein approximating the 3D fields for each element of the 3D mesh comprises:

approximating first 3D fields for a first element of the 3D mesh on one periodic boundary using one or more first spatial basis functions; and approximating second 3D fields for a second element of the 3D mesh on an opposite periodic boundary with one or more second spatial basis functions, wherein the one or more second spatial basis functions comprise the one or more first spatial basis functions multiplied by a phase shift factor, wherein the phase shift factor is a function of an angle of incident light and pitch in one or more directions of periodicity.

26. An optical measurement system comprising:

a light source to illuminate a diffracting structure with an incident beam and a detector to detect a resulting spectral signal;

first logic to receive measured spectral information for the diffracting structure; and second logic to:
provide a 3D spatial model of the diffracting structure in a simulation domain, the simulation domain being a spatial domain, providing the 3D spatial model including constructing a geometric model of the diffracting structure and determining how to parameterize the geometric model;
split the simulation domain into a plurality of subdomains;
discretize the model into a 3D spatial mesh in the simulation domain;
approximate 3D fields for each element of the 3D mesh using 3D spatial basis functions in the spatial domain
generate a matrix comprising coefficients of the 3D spatial basis functions approximating fields in a subdomain of the spatial domain;
compute the coefficients of the 3D spatial basis functions using the matrix;
compute spectral information for the model based on the computed coefficients;
compare the computed spectral information for the model with the measured spectral information; and
in response to a determination of a model fit by the second logic, determine a physical characteristic of the diffracting structure based on the model of the diffracting structure, the physical characteristic being a geometric or material characteristic of the diffracting structure, wherein the second logic, in approximating the 3D fields for each element of the 3D mesh, is configured to:
approximate first 3D fields for a first element of the 3D mesh on one periodic boundary using one or more first spatial basis functions; and
approximate second 3D fields for a second element of the 3D mesh on an opposite periodic boundary with one or more second spatial basis functions, wherein the one or more second spatial basis functions comprise the one or more first spatial basis functions multiplied by a phase shift factor, wherein the phase shift factor is a function of an angle of incident light and pitch in one or more directions of periodicity.

* * * * *